United States Patent
Nagai et al.

(10) Patent No.: US 8,624,208 B2
(45) Date of Patent: Jan. 7, 2014

(54) EXTREME ULTRAVIOLET LIGHT GENERATION SYSTEM

(75) Inventors: Shinji Nagai, Kanagawa (JP); Tamotsu Abe, Kanagawa (JP); Hitoshi Nagano, Kanagawa (JP); Osamu Wakabayashi, Kanagawa (JP)

(73) Assignee: Gigaphoton Inc., Tochigi (JP)

( * ) Notice: Subject to any disclaimer, the term of this patent is extended or adjusted under 35 U.S.C. 154(b) by 303 days.

(21) Appl. No.: 13/048,454

(22) Filed: Mar. 15, 2011

(65) Prior Publication Data

US 2011/0226745 A1    Sep. 22, 2011

(30) Foreign Application Priority Data

| Mar. 18, 2010 | (JP) | 2010-063358 |
| Jan. 28, 2011 | (JP) | 2011-017252 |
| Mar. 7, 2011  | (JP) | 2011-049687 |

(51) Int. Cl.
    *G21K 5/00*    (2006.01)
(52) U.S. Cl.
    USPC .................................................. 250/504 R
(58) Field of Classification Search
    USPC ............... 250/504 R, 503.1, 493.1, 492.1; 219/121.68, 121.84
    See application file for complete search history.

(56) References Cited

U.S. PATENT DOCUMENTS

| 6,882,704 | B2 * | 4/2005  | Schriever et al. | 378/119 |
| 7,615,766 | B2   | 11/2009 | Nakano           |         |
| 7,641,349 | B1 * | 1/2010  | Chrobak et al.   | 359/845 |
| 7,916,388 | B2 * | 3/2011  | Bykanov          | 359/349 |

FOREIGN PATENT DOCUMENTS

JP    2007-266234    10/2007

* cited by examiner

*Primary Examiner* — Samuel M Heinrich
(74) *Attorney, Agent, or Firm* — McDermott Will & Emery LLP

(57) ABSTRACT

An extreme ultraviolet light generation system is an extreme ultraviolet light generation system which is used with a laser apparatus and is connected to an external device so as to supply extreme ultraviolet light thereto, and the extreme ultraviolet light generation system may include: a chamber provided with at least one inlet through which a laser beam is introduced thereinto; a target supply unit provided to the chamber for supplying a target material to a predetermined region inside the chamber; a discharge pump connected to the chamber; at least one optical element disposed inside the chamber; an etching gas introduction unit provided to the chamber through which etching gas passes, the etching gas being introduced to etch debris of the target material which is emitted when the target material is irradiated with the laser beam inside the chamber and adheres to the at least one optical element; and at least one temperature control mechanism for controlling a temperature of the at least one optical element.

26 Claims, 23 Drawing Sheets

EXTREME ULTRAVIOLET LIGHT GENERATION SYSTEM

CROSS-REFERENCE TO RELATED APPLICATIONS

The present application claims priority from Japanese Patent Application No. 2010-063358 filed Mar. 18, 2010, Japanese Patent Application No. 2011-017252 filed Jan. 28, 2011, and Japanese Patent Application No. 2011-049687 filed Mar. 7, 2011, the disclosure of each of which is incorporated herein by reference in its entirety.

BACKGROUND

1. Technical Field

This disclosure relates to an extreme ultraviolet (EUV) light generation system for generating extreme ultraviolet light.

2. Related Art

With recent increase in integration of semiconductor process, transfer patterns for use in photolithography of the semiconductor process have rapidly become finer. In the next generation, microfabrication at 70 to 45 nm, further, microfabrication at 32 nm or less is to be demanded. Accordingly, to meet the demand for microfabrication at 32 nm or less, for example, an exposure apparatus is expected to be developed, where EUV light at a wavelength of approximately 13 nm is combined with a reduction projection reflective optical system.

There are mainly three types of known EUV light generation systems, namely, a laser produced plasma (LPP) type apparatus using plasma generated as a target material is irradiated with a laser beam, a discharge produced plasma (DPP) type apparatus using plasma generated by discharge, and a synchrotron radiation (SR) type apparatus using orbital radiation.

SUMMARY

An extreme ultraviolet light generation system according to one aspect of this disclosure is an extreme ultraviolet light generation system which is used with a laser apparatus and is connected to an external device so as to supply extreme ultraviolet light thereto, and the extreme ultraviolet light generation system may include: a chamber provided with at least one inlet through which a laser beam is introduced thereinto; a target supply unit provided to the chamber for supplying a target material to a predetermined region inside the chamber; a discharge pump connected to the chamber; at least one optical element disposed inside the chamber; an etching gas introduction unit provided to the chamber through which etching gas passes, the etching gas being introduced to etch debris of the target material which is emitted when the target material is irradiated with the laser beam inside the chamber and adheres to the at least one optical element; and at least one temperature control mechanism for controlling a temperature of the at least one optical element.

These and other objects, features, aspects, and advantages of this disclosure will become apparent to those skilled in the art from the following detailed description, which, taken in conjunction with the annexed drawings, discloses preferred embodiments of this disclosure.

DETAILED DESCRIPTION OF PREFERRED EMBODIMENTS

Figure 1:
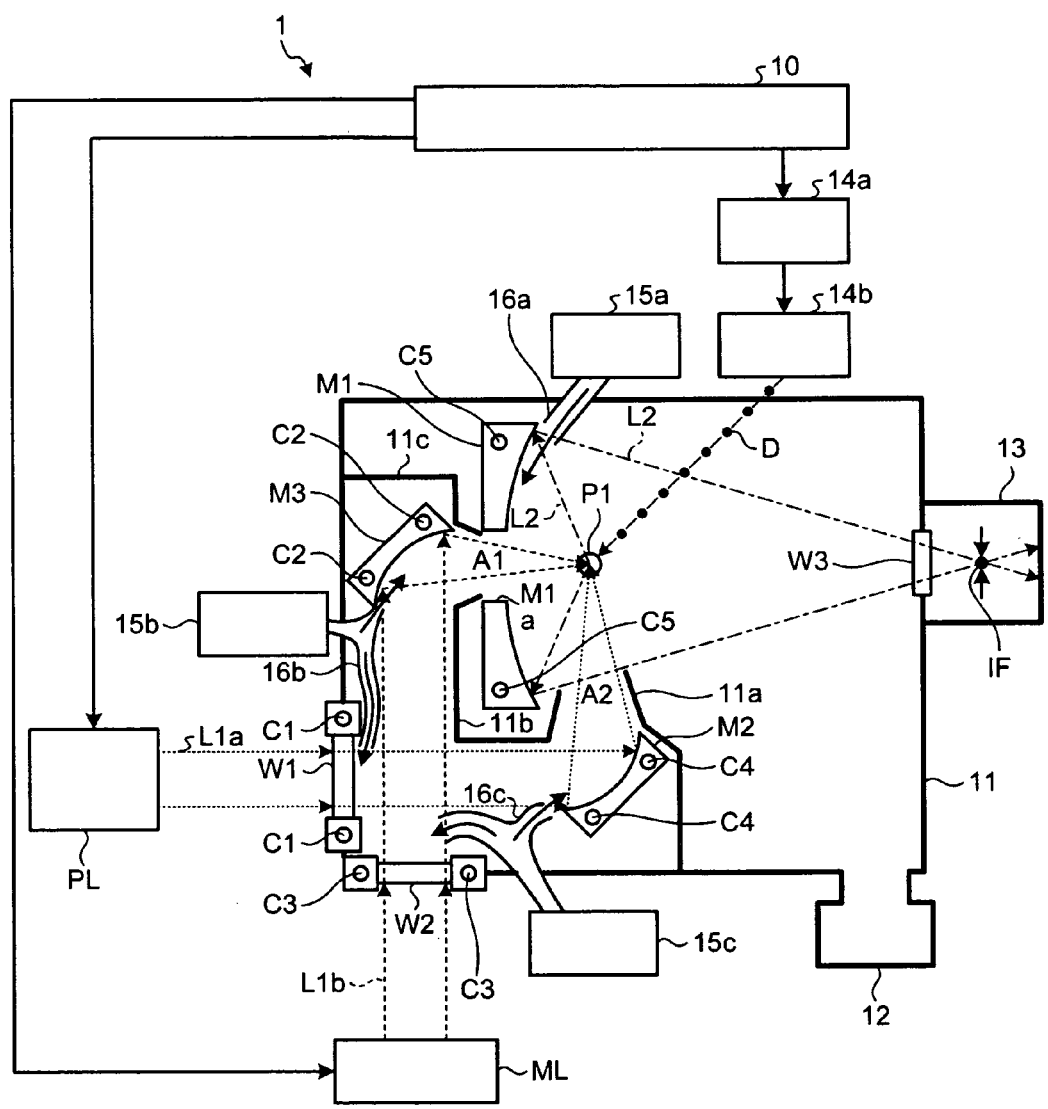
FIG. 1 schematically illustrates the configuration of an EUV light generation system according to a first embodiment of this disclosure.

Hereinafter, embodiments for implementing this disclosure will be described in detail with reference to the accompanying drawings. In the subsequent description, each drawing merely illustrates shape, size, positional relationship, and so on, schematically to the extent that enables the content of this disclosure to be understood; thus, this disclosure is not limited to the shape, the size, the positional relationship, and so on, illustrated in each drawing. In order to show the configuration clearly, part of hatching along a section is omitted in the drawings. Further, numerical values indicated hereafter are merely preferred examples of this disclosure; thus, this disclosure is not limited to the indicated numerical values.

First Embodiment

An EUV light generation system according to a first embodiment of this disclosure will be described in detail with reference to the drawings. FIG. 1 schematically illustrates the configuration of an EUV light generation system 1 according to the first embodiment.

As illustrated in FIG. 1, the EUV light generation system 1 may include: a highly airtight chamber defining a space for generation of EUV light; an exposure-apparatus connection 13 with which the chamber 11 is optically connected to an exposure apparatus (not shown); a droplet controller 14a and a droplet generator 14b for supplying into the chamber 11, in the form of a liquid droplet D, a target material, such as tin (Sn), serving as a material for generating EUV light; a pre-pulse laser PL and a main pulse laser ML for outputting pulsed laser beams (pre-pulse laser beam L1a and main pulse laser beam L1b) for turning the droplet D into plasma; and an EUV light generation controller 10 for appropriately controlling the pre-pulse laser PL, the main pulse laser ML, the droplet controller 14a, and so on. The droplet D may be supplied into the chamber 11 through a tip of a nozzle (not shown) provided to the droplet generator 14b.

The chamber 11 may be provided with windows W1 and W2, and the pre-pulse laser beam L1a and the main pulse laser beam L1b may pass through the windows W1 and W2, respectively, and enter the chamber 11. Inside the chamber 11, off-axis paraboloidal mirrors M2 and M3 for respectively focusing the pre-pulse laser beam L1a and the main pulse laser beam L1b, which have entered the chamber through the windows W1 and W2, at a predetermined position in a plasma generation region P1 inside the chamber 11, and an EUV collector mirror M1 for reflecting EUV light L2 generated in the plasma generation region P1 such that the EUV light L2 is focused at an intermediate focus IF set inside the exposure-apparatus connection 13 may be provided.

In such a configuration, the EUV light generation controller 10 may control the droplet controller 14a to thereby control the timing at which the droplet D is outputted from the droplet generator 14b. The droplet D outputted from the droplet generator 14b may arrive in the plasma generation region P1. At the timing at which the droplet D arrives in the plasma generation region P1, the pre-pulse laser beam L1a outputted from the pre-pulse laser PL may be focused on the droplet D via the window W1 and the off-axis paraboloidal mirror M2 from a side surface side of the EUV collector mirror M1 (first-stage laser irradiation). With this, the droplet D may be diffused, and the liquid target material may be turned into a state in which weak plasma, neutral particles, clusters, fragments, and so on, mixedly exist. In the description to follow, this state is referred to as a "diffused target."

The main pulse laser beam L1b outputted from the main pulse laser ML may be focused on the diffused target generated in the plasma generation region P1 via the window W2 and the off-axis paraboloidal mirror M3 from the back surface side of the EUV collector mirror M1 (second-stage laser irradiation). With this, the diffused target may be turned into plasma. EUV light L2 is emitted when this plasma deexcites. Note that a through-hole M1a through which the main pulse laser beam L1b passes may be provided in the EUV collector mirror M1. The timing at which the pre-pulse laser beam L1a is outputted from the pre-pulse laser PL and the timing at which the main pulse laser beam L1b is outputted from the main pulse laser ML may be controlled by the EUV light generation controller 10. The droplet D may be irradiated with the pre-pulse laser beam L1a at the timing at which the droplet D arrives in the plasma generation region P1, and the diffused target generated in the plasma generation region P1 may be irradiated with the main pulse laser beam L1b.

The EUV light L2 emitted from the plasma may be reflected by the EUV collector mirror M1 having a spheroidal reflective surface, to thereby be reflected toward the exposure-apparatus connection 13. The reflected EUV light L2 may be focused at the intermediate focus IF set in the exposure-apparatus connection 13, as described above. After that, the EUV light L2 may be propagated to the exposure apparatus through a waveguide (such as a tube) (not shown).

The target material (droplet D) is turned into plasma with two-stage laser beam irradiation in the first embodiment, but without being limited thereto, the target material may be turned into plasma with one-stage, or three-or-more-stage laser irradiation. Further, the target material is supplied in the form of a liquid droplet in the first embodiment, but without being limited thereto, a solid target material preset rotatably in the chamber 11 may be used.

After the EUV light L2 is emitted, particles of Sn serving as the target material, such as ions, atoms, charged particles, and neutral particles (hereinafter referred to as Sn debris), may be generated from the plasma generated in the plasma generation region P1. This Sn debris, having been emitted from the plasma generation region P1, may adhere to and accumulate on the optical elements, such as the EUV collector mirror M1 and the off-axis paraboloidal mirrors M2 and M3, disposed in the chamber 11.

Accordingly, the EUV light generation system 1 of the first embodiment may include radical generators 15a through 15c for supplying hydrogen radicals (hereinafter referred to as H radicals or H*) into the chamber 11, and a discharge pump 12 for discharging gas from the chamber 11. H radicals emitted from the radical generators 15a through 15c may be supplied into the chamber 11 through gas introduction pipes 16a through 16c extending into the chamber 11. The radical generators 15a through 15c and the gas introduction pipes 16a through 16c may allow etching gas (H radical or $H_2$ gas that has not been turned into H radical) for etching the Sn debris adhering to the optical elements provided in the chamber 11 to flow along the surface of the optical elements.

Gas discharge ports of the gas introduction pipes 16a through 16c preferably point respectively toward the optical elements, such as the EUV collector mirror M1 and the off-axis paraboloidal mirrors M2 and M3, provided in the chamber 11. With this, H radicals may flow along the surfaces of the optical elements to which the Sn debris has adhered, and the H radicals may react with the Sn debris on the surfaces of the optical elements, whereby stannane ($SnH_4$) gas may be generated. This stannane gas is in a gaseous state approximately at or above −52° C. Therefore, allowing Sn and the H radicals to react to thereby generate the stannane gas makes it possible to etch the Sn debris on the surfaces of the optical elements. As a result, performance degradation of the optical elements can be prevented.

The stannane gas generated by allowing the H radicals to flow along the surfaces of the optical elements may be discharged outside the chamber 11 with the discharge pump 12. In the first embodiment, hydrogen is preferably supplied in the form of a radical, in order to allow the Sn debris adhering to the optical elements to undergo the etching reaction with high efficiency; however, without being limited thereto, hydrogen may be supplied in the form of hydrogen molecules ($H_2$). In this case, when hydrogen molecules are turned into H radicals by ultraviolet light, vacuum ultraviolet light, EUV light, and the like, emitted in the plasma generation region P1, the H radicals may react with the Sn debris adhering to the optical elements, whereby stannane ($SnH_4$) may be generated. As a result, the Sn debris adhering to the optical elements may be etched, and performance degradation of the optical elements can be prevented. In such case, the radical generators 15a through 15c are not required. A hydrogen gas supply source may be provided, in place of the radical generators 15a through 15c. The hydrogen gas supply source may be provided at a facility where an exposure apparatus is installed, or it may be provided to either of the EUV light generation system and the exposure apparatus.

Plate-shaped partitions 11a through 11c, for example, may be provided in the chamber 11. The flow of gas (H radicals, hydrogen gas, stannane gas, and so on) inside the chamber 11 may be controlled with the partitions 11a through 11c. As a result, the Sn debris adhering to the optical elements can effectively be etched, and the generated stannane gas can efficiently be discharged. An opening A1 defined between the partitions 11b and 11c may function as a flow channel for the etching gas and as an optical path of the main pulse laser beam L1a. An opening A2 defined between the partitions 11a and 11b may function as a flow channel for the etching gas and as an optical path of the pre-pulse laser beam L1a.

The flow of gas is controlled with the partitions 11a through 11c such that the gas flows from the optical elements (such as the EUV collector mirror M1 and the off-axis paraboloidal mirrors M2 and M3) to the plasma generation region P1 where the debris is generated, whereby the incidence of the Sn debris onto the optical elements can be suppressed. With this, adhesion of the Sn debris onto the optical elements can be minimized, and hence performance degradation of the optical elements can be prevented more reliably.

Figure 2:
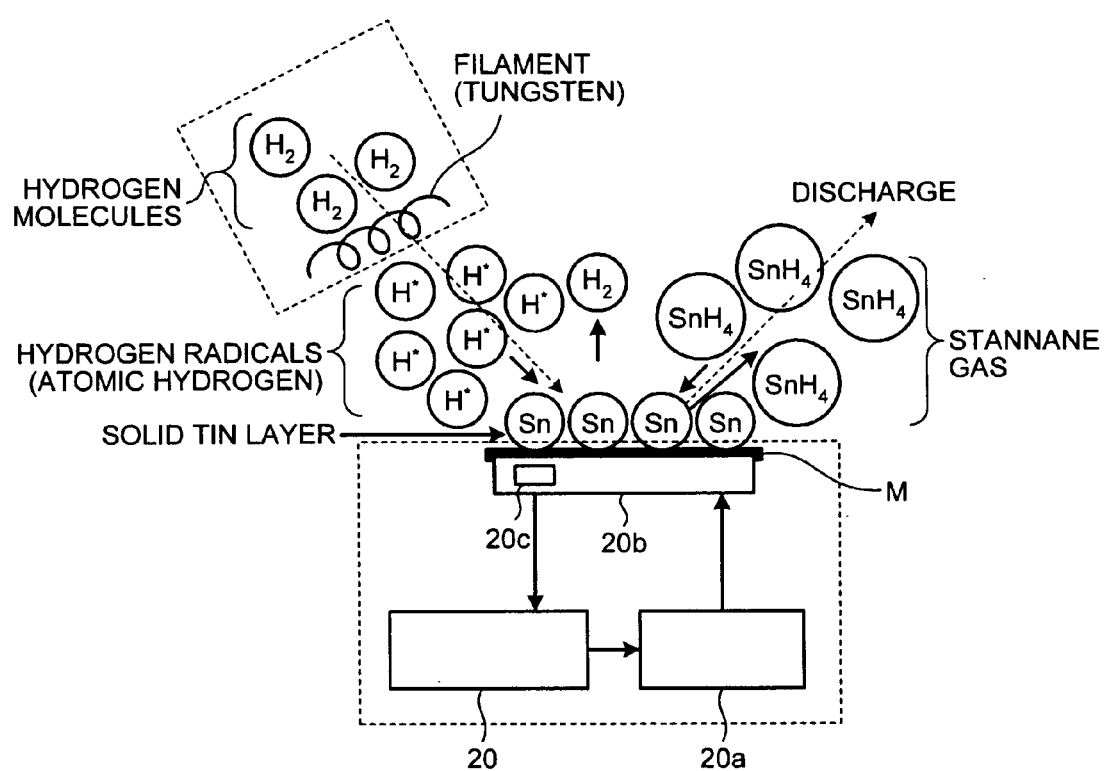
FIG. 2 schematically illustrates a reaction in which hydrogen gas is changed into a hydrogen radical, which reacts with solid Sn on an optical element to thereby be turned into stannane gas, and a reaction in which stannane gas is decomposed and solid Sn is deposited.

FIG. 2 schematically illustrates a reaction in which hydrogen gas is changed into hydrogen radicals and reacts with solid Sn on the optical element to be turned into stannane gas and a reaction in which the stannane gas is decomposed and solid Sn is deposited. The reaction of Sn and H radicals may be expressed by the following chemical reaction formulae (1) and (2):

$$\text{etching reaction: } Sn(s) + 4H^*(g) \rightarrow SnH_4(g) \tag{1}$$

$$\text{deposition reaction: } SnH_4 \rightarrow Sn(s) + 2H_2 \tag{2}$$

Here, (s) and (g) indicate a solid state and a gaseous state, respectively. The reactions given by the chemical reaction formulae (1) and (2) may occur simultaneously. The total etching rate Val is expressed as the difference between the etching reaction rate V1 and the deposition rate V2, as given by the following expression (3):

$$Val = V1 - V2 \tag{3}$$

The etching rate V1, the deposition rate V2, and the total etching rate Val may fluctuate depending on the temperature of the optical element when the concentrations of H radicals, $H_2$, and $SnH_4$ are constant.

FIG. 2, illustrates the schematic of the configuration (temperature control mechanism) for controlling the temperature of an optical element. The temperature control mechanism may include: a temperature control element 20b provided on an optical element M, such as the EUV collector mirror M1; a power supply 20a for supplying electric current to the temperature control element 20b; a temperature sensor 20c provided on the optical element M; and a temperature controller 20 for controlling the electric current to be supplied to the temperature control element 20b by the power supply 20a, based on the temperature detected by the temperature sensor 20c. As an example of the temperature control element 20b, a heater may be used, and the electric current supplied to the heater may be controlled based on the detection result of the temperature sensor 20c, whereby the temperature may be stabilized at a predetermined temperature.

Figure 3:
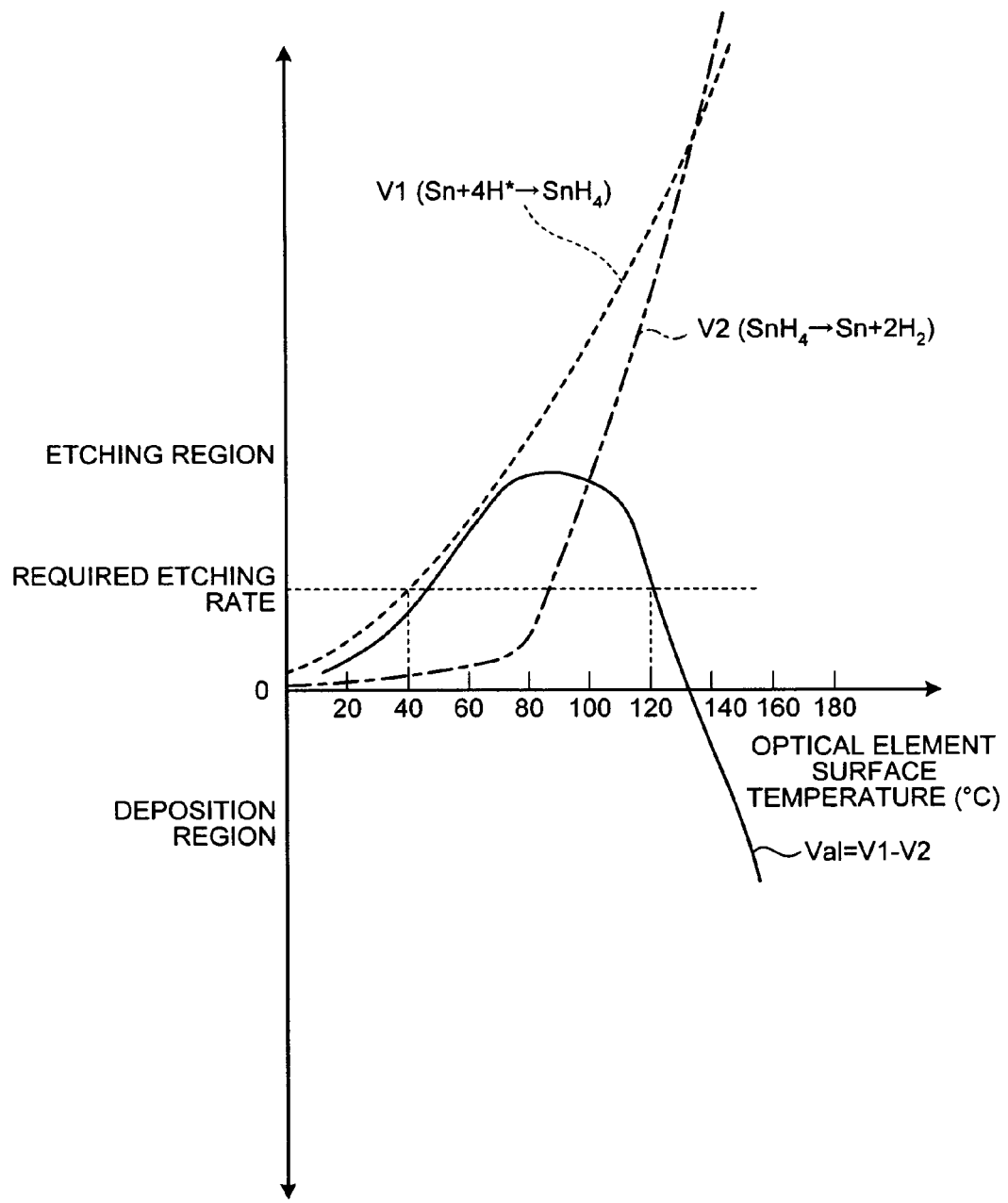
FIG. 3 is a graph showing relationship between the temperature and each of an etching reaction rate of Sn, a deposition reaction rate of Sn, and a total etching rate represented by a difference between the etching reaction rate of Sn and the deposition rate of Sn.

The total etching rate Val with respect to the set temperatures (within the range from the normal temperature to the temperature to which heating control is possible) has been measured. FIG. 3 is a graph showing relationship between the temperature and each of an etching reaction rate of Sn, a deposition reaction rate of Sn, and a total etching rate represented by a difference between the etching reaction rate of Sn and the deposition rate of Sn. In FIG. 3, a dashed line indicates the temperature dependency of the etching rate V1, and a one-dot dashed line indicates the temperature dependency of the deposition rate V2. A solid line indicates the total etching rate Val (=V1−V2). The case where the total etching rate is 0 indicates that the etching rate V1 is equal to the deposition rate V2, and In this a case, Sn adhering to the surface of the optical element cannot be removed. The case where the total etching rate Val is positive indicates that Sn adhering to the surface of the optical element can be etched. Conversely, the case where the total etching rate Val is negative indicates that Sn is further deposited on the surface of the optical element. Therefore, the electric current supplied to the temperature control element 20b from the power supply 20a is controlled with the temperature controller 20 based on an actually observed temperature such that the temperature of the optical element M is maintained within a target temperature range (for example, not lower than 40° C. and not higher than 120° C., preferably, not lower than 60° C. and not higher than 100° C.), whereby the total etching rate Val may be maintained at a required etching rate, and Sn adhering to the optical element can be removed.

Figure 4:
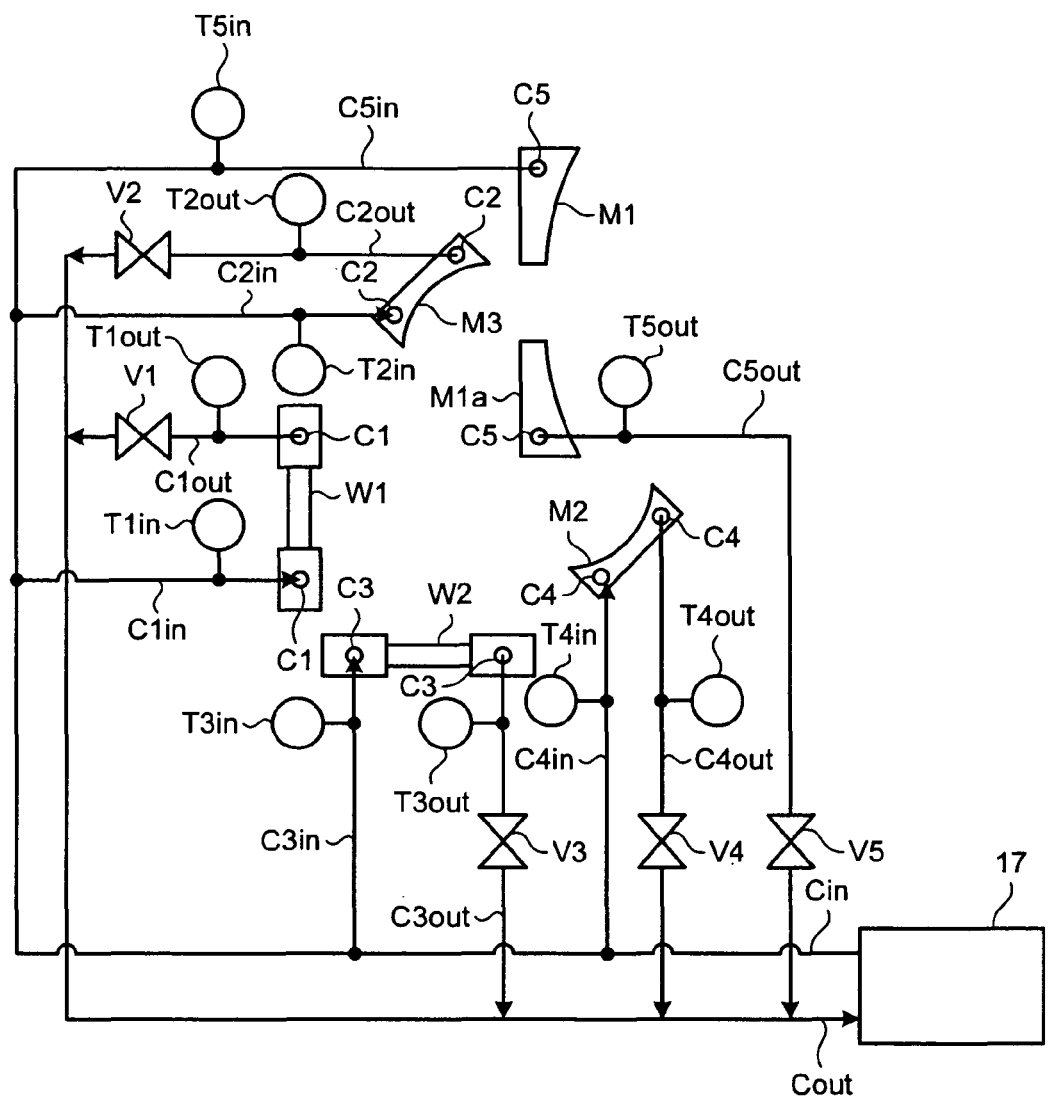
FIG. 4 schematically illustrates the configuration for controlling the temperature of an optical element disposed in a chamber according to a first embodiment.

As illustrated in FIG. 3, the total etching rate Val of Sn adhering to the optical element rises as the temperature rises, while the temperature of the surface of the optical element is from 0° C. to approximately 60° C. Meanwhile, when the temperature of the surface of the optical element exceeds approximately 100° C., the total etching rate Val starts to fall. Accordingly, in the first embodiment, the temperature of the optical element provided in the chamber 11 is controlled to be within, for example, a temperature range of not lower than 40° C. and not higher than 120° C., preferably, of not lower than 60° C. and not higher than 100° C. With this, the stannane gas may be prevented from being decomposed, whereby Sn may be prevented from being deposited on the surface of the optical element. As a result, Sn may be prevented from being deposited again on the optical element. FIG. 4 schematically illustrates the configuration for controlling the temperature of the optical elements provided in the chamber according to the first embodiment. In FIG. 4, the windows W1 and W2, the EUV collector mirror M1, and the off-axis paraboloidal mirrors M2 and M3 (hereinafter simply referred to as optical elements W1 and W2 and M1 through M3) are given as examples of the optical elements of which the temperatures are to be controlled; however, this disclosure is not limited to these.

As illustrated in FIG. 4, the EUV light generation system 1 of the first embodiment may include a chiller 17 provided outside the chamber 11. The chiller 17 may feed, into a main supply pipe Cin, a heat carrier (for example, liquid that is stable at the operating temperature, such as temperature-controlled water or oil) for controlling the temperatures of the optical elements W1 and W2 and M1 through M3. Sub-supply pipes C1in through C5in may branch off from the main supply pipe Cin to the optical elements W1 and W2 and M1 through M3, respectively. With this, the temperature-controlled heat carrier fed into the main supply pipe Cin may be supplied to the optical elements W1 and W2 and M1 through M3 via the sub-supply pipes C1in through C5in, respectively.

The optical elements W1 and W2 and M1 through M3 may include heat carrier flow channels C1 through C5 through which the heat carrier fed thereinto circulates. The heat carrier distributed into the sub-supply pipes C1in through C5in may flow into the heat carrier flow channels C1 through C5 of the optical elements W1 and W2 and M1 through M3, and then circulate inside the optical elements W1 and W2 and M1 through M3. With this, the temperatures of the optical elements W1 and W2 and M1 through M3 may be controlled to be within the target temperature range.

The heat carrier having circulated in the heat carrier flow channels C1 through C5 of the optical elements W1 and W2 and M1 through M3 may then flow into sub-discharge pipes C1out through C5out connected to the heat carrier flow channels C1 through C5. The sub-discharge pipes C1out through C5out may be connected to a main discharge pipe Cout connected to the chiller 17. The heat carrier having flowed into the sub-discharge pipes C1out through C5out may then return to the chiller 17 via the main discharge pipe Cout. The heat carrier having returned to the chiller 17 may be fed out into the main supply pipe Cin again after the temperature thereof is controlled.

The sub-supply pipes C1in through C5in and the sub-discharge pipes C1out through C5out may respectively be provided with temperature sensors T1in through T5 in and T1out through T5out for detecting the temperature of the heat carrier flowing through the pipes. The total flow rate and the temperature of the temperature sensors T1in through T5 in and T1out through T5out may be controlled, for example, by the EUV light generation controller 10 or by the chiller 17 equipped with a circulation pump (not shown). With this, the heat carrier may be supplied smoothly to the optical elements W1 and W2 and M1 through M3.

The sub-discharge pipes C1out through C5out of the optical elements W1 and W2 and M1 through M3 may be provided with flow-rate control valves V1 through V5, respectively. For example, the EUV light generation controller 10 or the chiller 17 may control the flow-rate control valves V1 through V5, in order to control the flow rate of the heat carrier flowing into the optical elements. With this, the flow rate of the heat carrier flowing through the sub-discharge pipes C1out through C5out may be controlled. As a result, the flow rate of the heat carrier flowing through the optical elements W1 and W2 and M1 through M3 may be controlled, and the temperatures of the optical elements W1 and W2 and M1 through M3 may be controlled to be within the target temperature range.

As described above, according to the first embodiment, the temperature of the optical element can be controlled so that the target material etched with the etching gas is not deposited on the optical element again; hence, an EUV light generation system can be realized, in which performance degradation of the optical elements provided in the chamber can be prevented.

Second Embodiment

Next, an EUV light generation system according to a second embodiment of this disclosure will be described in detail with reference to the drawings.

Figure 5:
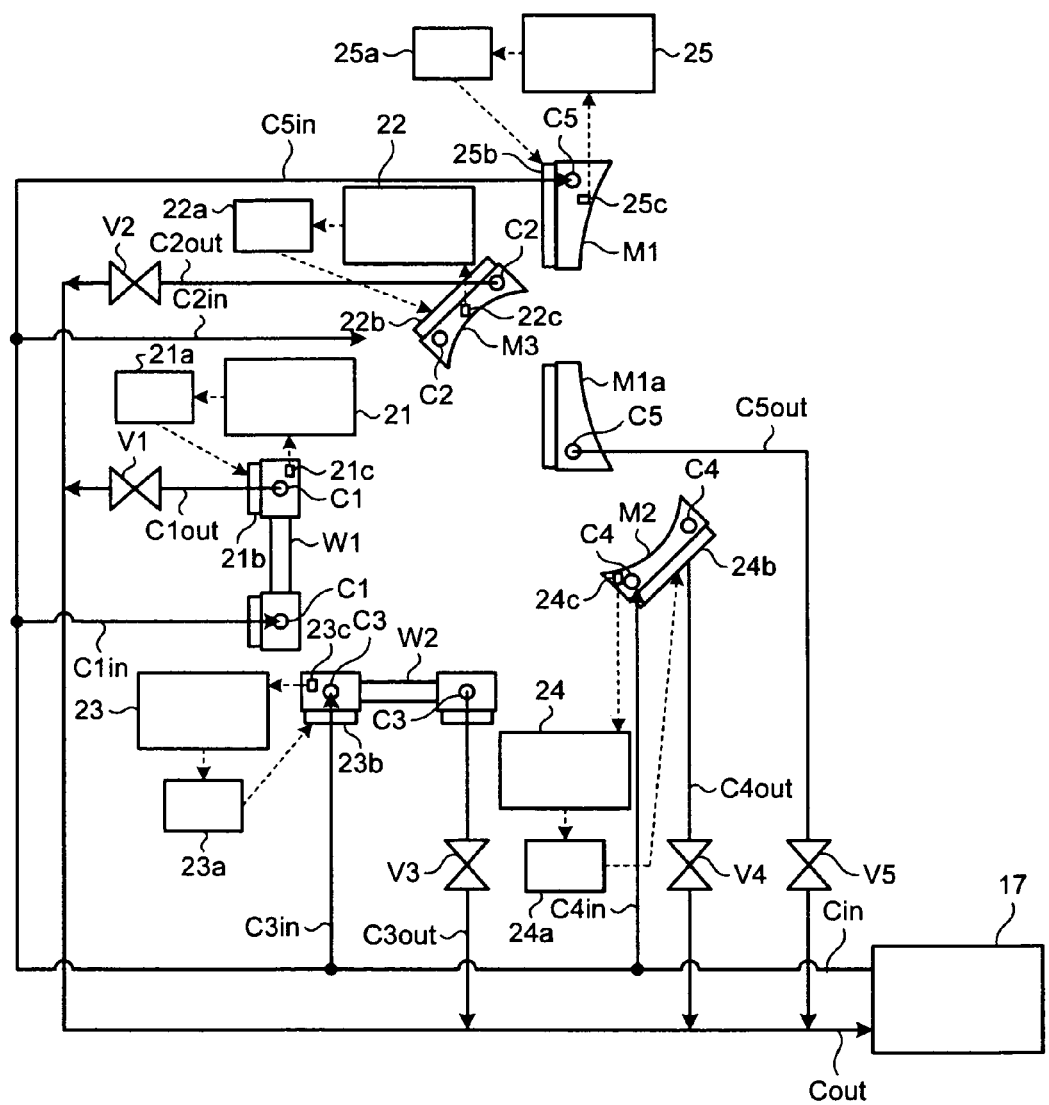
FIG. 5 schematically illustrates the configuration for controlling the temperature of an optical element disposed in a chamber of an EUV light generation system according to a second embodiment of this disclosure.

FIG. 5 schematically illustrates the configuration for controlling the temperatures of the optical elements provided in the chamber of the EUV light generation system according to the second embodiment. In the second embodiment, a temperature control mechanism in which cooling water and a heater is combined may be applied to the EUV light generation system 1 of the above-described first embodiment. According to this configuration, a temperature control mechanism in which the chiller 17, capable of large-capacity temperature control, is used can be used in combination with a temperature control mechanism in which the heater 20b, capable of heating and cooling, is used. With this, the temperature of the optical elements can be controlled with higher precision, whereby adhesion of Sn onto the optical elements can further be minimized. Consequently, performance degradation of the optical elements can further be reduced.

As illustrated in FIG. 5, the EUV light generation system of the second embodiment may be such that, in the configuration similar to that illustrated in FIG. 4, the optical elements W1 and W2 and M1 through M3 are further provided with heaters 21b through 25b and temperature sensors 21c through 25c. The heaters 21b through 25b may be connected to power supplies 21a through 25a, respectively. The temperature detected by the temperature sensors 21c through 25c may be inputted to temperature controllers 21 through 25, respectively. The temperature controllers 21 through 25 may control the electric current supplied to the heaters 21b through 25b by the power supplies 21a through 25a such that the temperatures inputted from the temperature sensors 21c through 25c are within a target temperature range. The heaters 21b through 25b may heat the optical elements W1 and W2 and M1 through M3 in accordance with the electric current supplied from the power supplies 21a through 25a. With this, the temperatures of the optical elements W1 and W2 and M1 through M3 may be controlled so that the temperatures of the optical elements W1 and W2 and M1 through M3 are within the target temperature range. In the case where the temperature exceeds the target temperature range, the optical elements may be cooled with cooling water in the chiller 17, and the temperature of the optical elements can be controlled with high precision by applying heat thereto with the heaters.

As described above, according to the second embodiment, the temperature of the optical element can be controlled so that the target material etched with the etching gas is not deposited on the optical element again; hence, an EUV light generation system can be realized, in which performance degradation of the optical elements provided in the chamber can be prevented.

Other configurations and advantages are similar to those of the above-described first embodiment, duplicate descriptions thereof are omitted here.

Third Embodiment

Figure 6:
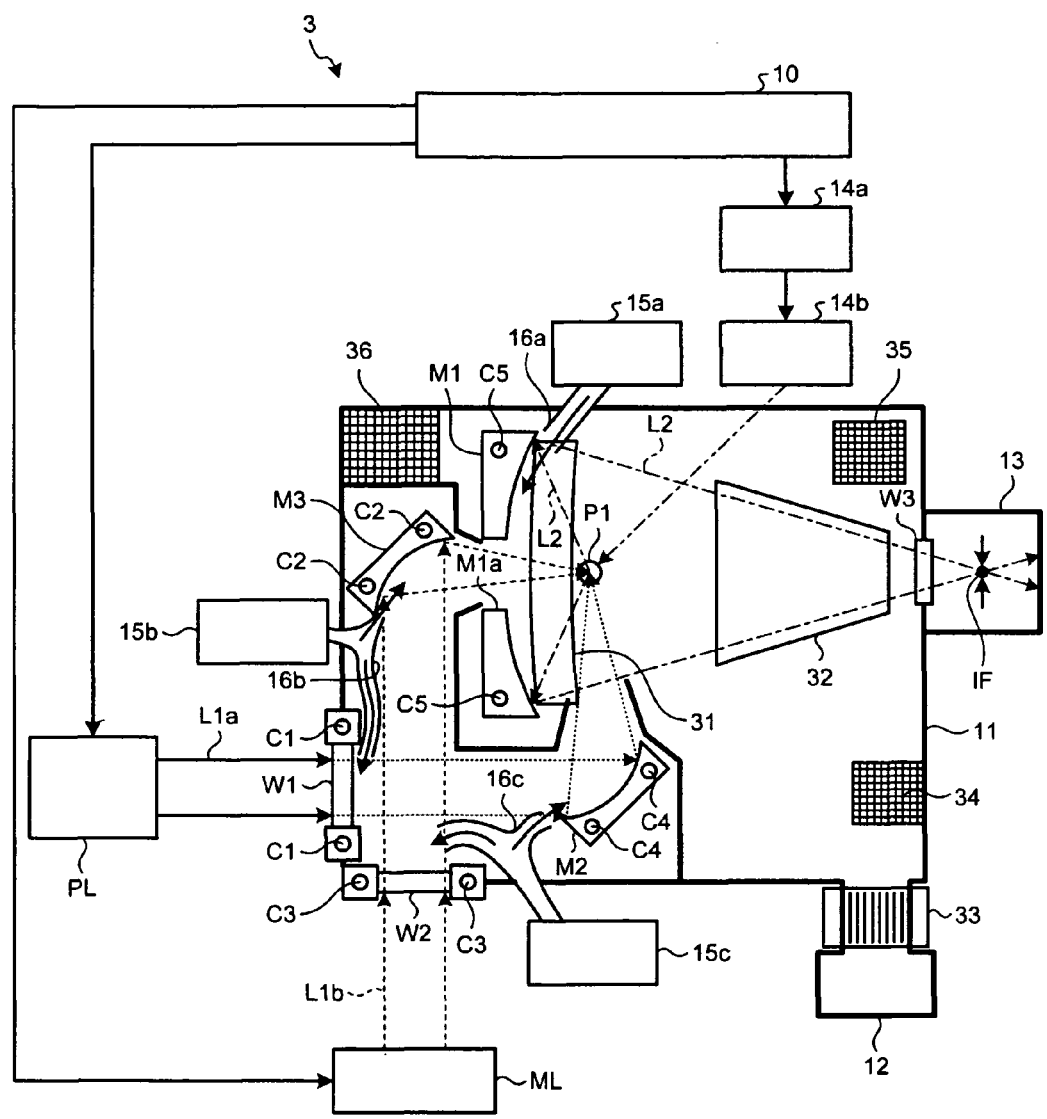
FIG. 6 schematically illustrates the configuration of an EUV light generation system according to a third embodiment of this disclosure.

Next, an EUV light generation system according to a third embodiment of this disclosure will be described in detail with reference to the drawings. FIG. 6 schematically illustrates the configuration of the EUV light generation system according to the third embodiment. In the third embodiment as well, the temperature control mechanism illustrated in FIG. 3 or FIG. 5 may be provided in the EUV light generation system.

As illustrated in FIG. 6, an EUV light generation system 3 according to the third embodiment may be such that, in the configuration similar to that of the EUV light generation system 1 illustrated in FIG. 1, traps 31 through for trapping Sn deposited when the stannane gas generated as Sn reacts with H radicals (or $H_2$) is decomposed may further be provided in the chamber 11. The trap 31 may be provided, for example, close to the reflective surface side of the EUV collector mirror M1, and may trap Sn deposited from the stannane gas generated from Sn adhering to the surface of the EUV collector mirror M1. The trap 32 may be provided, in the chamber 11, close to a gate valve W3, and may trap Sn deposited from the stannane gas flowing toward the exposure-apparatus connection 13 through the gate valve W3. The trap 33 may be provided at the connection between the chamber 11 and the discharge pump 12, and may trap Sn deposited from the stannane gas flowing into the discharge pump 12 from the interior of the chamber 11. The traps 34 through 36 may be provided at predetermined positions inside the chamber 11 (for example, positions to which Sn debris is likely to adhere), and may trap Sn deposited from the stannane gas existing in the chamber 11.

The temperatures of the traps 31 through 36 may be controlled to be equal to or higher than a temperature at which the stannane gas, for example, is decomposed and Sn is deposited (e.g., 120° C.). With this, in the third embodiment, the concentration of the stannane gas inside the chamber 11 can be reduced. As a result, the concentration of the stannane gas near the surface of a Sn layer accumulated on the surface of the optical element can be reduced as well; therefore, the total etching rate of Sn adhering to the surface of the optical element can be increased. Further, maintaining the temperatures of the traps 31 through 36 below the melting point of Sn (232° C.) may allow Sn deposited from the stannane gas to be fixed on the surfaces of the traps in a solid state. As the material of the traps 31 through 36, a material that is weakly reactive with Sn, such as molybdenum (Mo), titanium (Ti), alumina, or the like, may preferably be used.

Hereinafter, examples of the traps according to the third embodiment will be described in detail with reference to the drawings.

Trap 31

Figure 7:
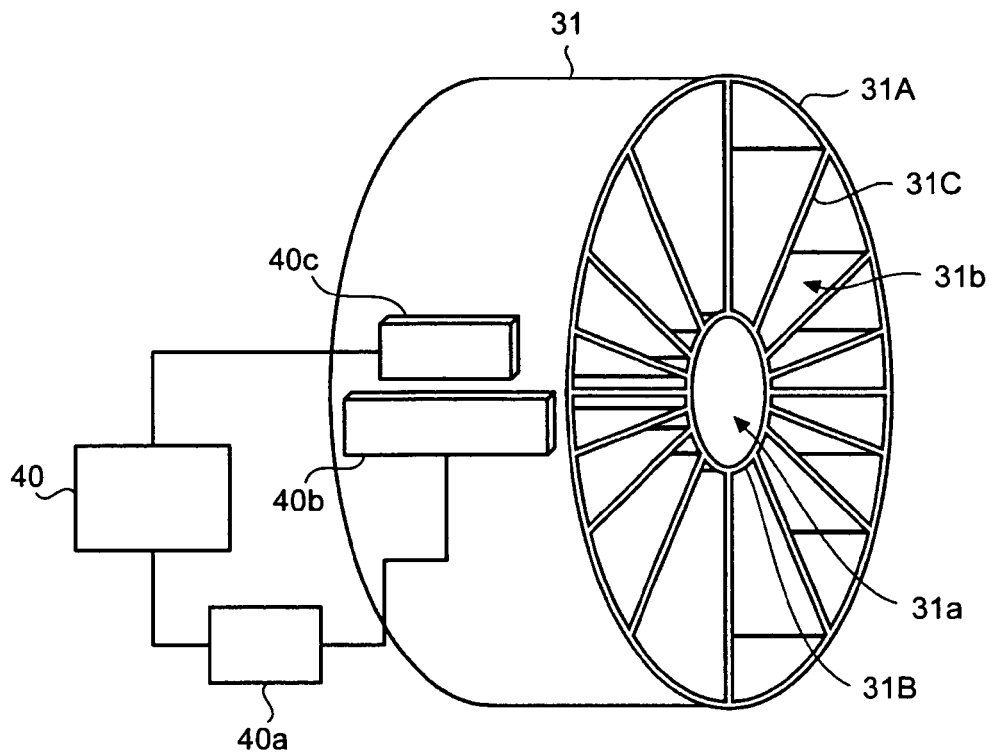
FIG. 7 schematically illustrates the configuration of a trap disposed close to the reflective surface side of an EUV collector mirror in the third embodiment.

FIG. 7 is a perspective view schematically illustrating the configuration of the trap provided close to the reflective surface side of the EUV collector mirror in the third embodiment. As illustrated in FIG. 7, the trap 31 may generally be in a column shape with both ends thereof being opened. Specifically, the trap 31 may have a double-ring structure of a cylindrical outer peripheral ring 31A with both ends thereof being opened, and a cylindrical laser-beam passing ring 31B, provided at the center of the outer peripheral ring 31A, with both ends thereof being opened. The outer peripheral ring 31A and the laser-beam passing ring 31B are preferably configured so as to be substantially coaxial. A space opened in the laser-beam passing ring 31B may function as a laser-beam passing hole 31a through which a laser beam (e.g., main pulse laser beam L1b) passing through the through hole M1a in the EUV collector mirror M1 may pass. A space between the outer peripheral ring 31A and the laser-beam passing ring 31B may function as an EUV-light passing hole 31b through which the EUV light L2 reflected by the EUV collector mirror M1 may pass. However, the EUV light L2 reflected by the EUV collector mirror M1 may travel outside the outer peripheral ring 31A or inside the laser-beam passing ring 31B aside from the EUV-light passing hole 31b.

Plate-shaped trapping blades 31C may radially extend from the outer surface of the laser-beam passing ring 31B to the inner surface of the outer peripheral ring 31A. The trapping blades 31C may have a function of anchoring the laser-beam passing ring 31B to the outer peripheral ring 31A, and a function of serving as blades for trapping Sn deposited from the stannane gas passing through the EUV-light passing hole 31b between the outer peripheral ring 31A and the laser-beam passing ring 31B. Note that the trapping blades 31C may divide the EUV-light passing hole 31b between the outer peripheral ring 31A and the laser-beam passing ring 31B into a plurality of regions.

The trap 31 having the above-described configuration may be provided close to the EUV collector mirror M1 and at the reflective surface side of the EUV collector mirror M1 such that the axis of the laser-beam passing ring 31B substantially coincides with the beam axis of the laser beam (e.g., main pulse laser beam L1b) focused in the plasma generation region P1 via the through hole M1a in the EUV collector mirror M1, and such that the axis of the outer peripheral ring 31A substantially coincides with the axis of the EUV light L2 reflected by the EUV collector mirror M1. With this, the trap 31 may allow the laser beam (e.g., main pulse laser beam L1b) passing through the through hole M1a in the EUV collector mirror M1 to pass therethrough without blocking the laser beam, and may allow the EUV light L2 reflected by the EUV collector mirror M1 to pass while preventing the energy of the EUV light L2 from being reduced.

The stannane gas generated by making H radicals (or $H_2$ gas) flow along the surface of the EUV collector mirror M1 may mainly flow inside the outer peripheral ring 31A. Accordingly, the trap 31 may be heated, for example, to a temperature equal to or higher than the temperature at which the stannane gas is decomposed and Sn is deposited (e.g., 120° C.), as described above. The trap 31 may be provided with a heater 40b heated with electric current. A power supply 40a may be connected to the heater 40b for supplying the electric current thereto. The trap 31 may be provided with a temperature sensor 40c. The temperature detected by the temperature sensor 40c may be inputted to a temperature controller 40. The temperature controller 40 may control the electric current supplied to the heater 40b from the power supply 40a based on the temperature detected by the temperature sensor 40c. With this, the trap 31 may be heated to a temperature equal to or higher than the temperature at which Sn may be deposited, and the stannane gas generated from Sn adhering to the surface of the EUV collector mirror M1 is heated and decomposed when passing through the laser-beam passing hole 31a or the EUV-light passing hole 31b, whereby Sn may be deposited. Accordingly, Sn, being deposited on the surface of at least any of the outer peripheral ring 31A, the laser-beam passing ring 31B, and the trapping blades 31C, may adhere thereto. That is, part of Sn generated in the form of the stannane gas from Sn adhering to the surface of the EUV collector mirror M1 may be collected with at least any of the outer peripheral ring 31A, the laser-beam passing ring 31B, and the trapping blades 31C. With this, the concentration of the stannane gas inside the chamber 11 can be reduced. As a result, the concentration of the stannane gas near the surface of a Sn layer deposited on the surface of the optical element can be reduced; therefore, the total etching rate of Sn adhering to the EUV collector mirror M1 can be increased. Further, maintaining the temperature of the trap 31 approximately below the melting point of Sn (232° C.) may allow Sn to be fixed on the trap 31 in a solid state.

Trap 32

Figure 8:
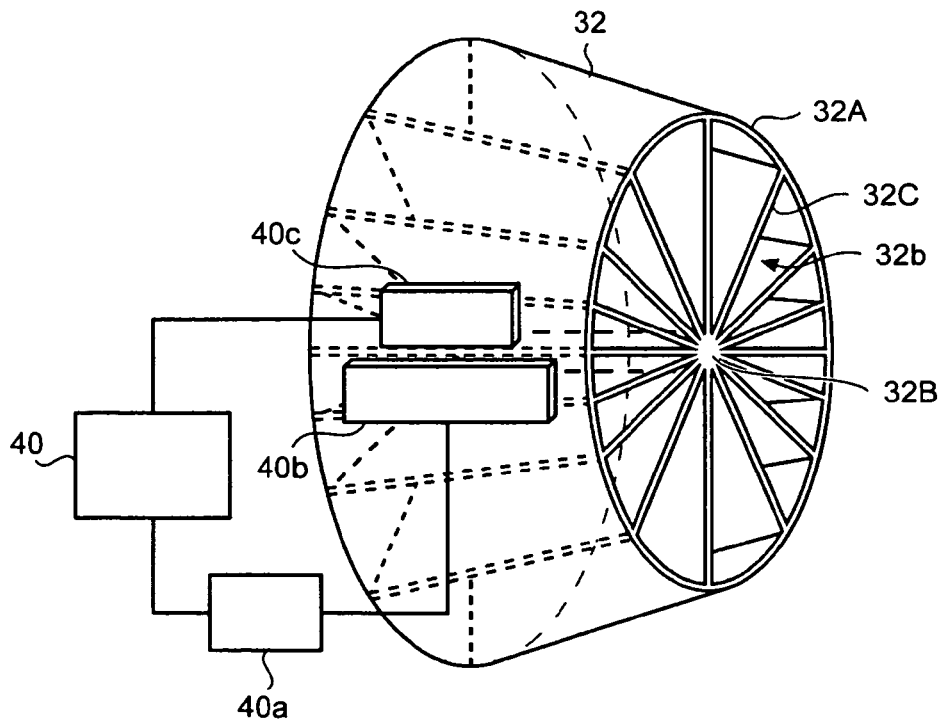
FIG. 8 is a perspective view schematically illustrating the configuration of a trap disposed close to a gate valve in the third embodiment.

FIG. 8 is a perspective view schematically illustrating the configuration of the trap provided near the gate valve in the third embodiment. As illustrated in FIG. 8, the trap 32 may be in a generally frustoconical shape with both ends being opened. Specifically, the trap 32 may include: an outer peripheral ring 32A in a frustoconical shape with both ends being opened; a rod-shaped core 32B provided at the center of the outer peripheral ring 32A; and a plurality of trapping blades 32C radially extending from the core 32B to an inner surface of the outer peripheral ring 32A. The core 32B may function to tie the plurality of the trapping blades 32C together. The core 32B may be omitted. A space opened in the outer peripheral ring 32A functions as an EUV-light passing hole 32b through which the EUV light L2 reflected by the EUV collector mirror M1 passes. However, the EUV light L2 reflected by the EUV collector mirror M1 may travel outside the outer peripheral ring 32A aside from the EUV-light passing hole 32b.

The plate-shaped trapping blades 32C may radially extend from the core 32B toward the inner surface of the outer peripheral ring 32A. The trapping blades 32C may function as blades for trapping Sn deposited from the stannane gas passing through the EUV-light passing hole 32b of the outer peripheral ring 32A. Note that the trapping blades 32C may divide the EUV-light passing hole 32b in the outer peripheral ring 32A into a plurality of regions.

The trap 32 having the above-described configuration may be disposed close to the gate valve W3 such that the axis of the outer peripheral ring 32A substantially coincides with the axis of the EUV light L2 reflected by the EUV collector mirror M1. With this, the trap 32 may allow the EUV light L2 reflected by the EUV collector mirror M1 to pass therethrough while preventing the energy of the EUV light L2 from being reduced.

The stannane gas flowing into the exposure-apparatus connection 13 via the gate valve W3 may mainly flow through the EUV-light passing hole 31b. Accordingly, the trap 32 may preferably be heated, for example, to a temperature equal to or higher than the temperature at which the stannane gas is decomposed and Sn is deposited (e.g., 120° C.), as described above. The trap 32 may be provided with a heater 40b heated with electric current. A power supply 40a may be connected to the heater 40b for supplying the electric current thereto. The trap 32 may be provided with a temperature sensor 40c. The temperature detected by the temperature sensor 40c may be inputted to a temperature controller 40. The temperature controller 40 may control the electric current supplied to the heater 40b from the power supply 40a based on the temperature detected by the temperature sensor 40c. With this, the trap 32 may be heated to a temperature equal to or higher than the temperature at which Sn may be deposited, and the stannane gas generated from Sn adhering to the surface of the EUV collector mirror M1 is heated and decomposed when passing through the laser-beam passing hole 31a or the EUV-light passing hole 31b, whereby Sn may be deposited. Accordingly, Sn, being deposited on the surface of at least any of the outer peripheral ring 32A, the core 32B, and the trapping blades 32C, may adhere thereto. That is, Sn flowing, in the form of the stannane gas, into the exposure apparatus via the gate valve W3 may be collected with at least any of the outer peripheral ring 32A, the core 32B, and the trapping blades 32C. With this, the stannane gas may be prevented from flowing into the exposure apparatus. Further, maintaining the temperature of the trap 32 approximately below the melting point of Sn (232° C.) may allow Sn to be fixed on the trap 32 in a solid state.

Trap 33

Figure 9:
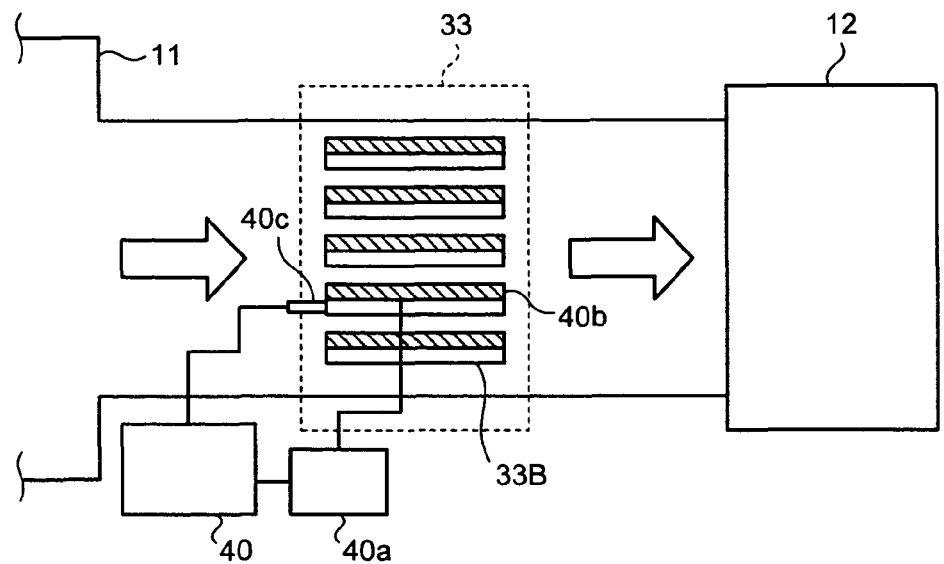
FIG. 9 schematically illustrates the configuration of a trap disposed at a connection between a chamber and a discharge pump of the third embodiment.

FIG. 9 schematically illustrates the configuration of the trap provided at the connection between the chamber and the discharge pump in the third embodiment. As illustrated in FIG. 9, the trap 33 may, for example, be configured such that a plurality of plate-shaped blades 33B is arranged substantially parallel to a direction in which gas flows from the chamber 11 to the discharge pump 12. The plurality of the plate-shaped blades 33B may be arranged such that a section thereof has a lattice pattern. The stannane gas flowing from the interior of the chamber 11 into the discharge pump 12 may flow through spaces divided into the lattice pattern by the blades 33B. Accordingly, the trap 33 may preferably be heated, for example, to a temperature equal to or higher than the temperature at which the stannane gas is decomposed and Sn is deposited (e.g., 120° C.), as described above. The trap 33 may be provided with a heater 40b heated with electric current. A power supply 40a may be connected to the heater 40b for supplying the electric current thereto. The trap 33 may be provided with a temperature sensor 40c. The temperature detected by the temperature sensor 40c may be inputted to a temperature controller 40. The temperature controller 40 may control the electric current supplied to the heater 40b from the power supply 40a based on the temperature detected by the temperature sensor 40c. With this, the trap 33 may be heated to a temperature equal to or higher than the temperature at which Sn may be deposited, and the stannane gas flowing into the discharge pump 12 may be heated and decomposed when passing through the spaces divided into the lattice pattern, whereby Sn may be deposited. Accordingly, Sn, being deposited on the surface of the blades 33B, may adhere thereto. That is, Sn flowing, in the form of the stannane gas, into the discharge pump 12 may be collected with the blades 33B. With this, the stannane gas may be prevented from flowing into the discharge pump 12. Further, maintaining the temperature of the trap 33 approximately below the melting point of Sn (232° C.) may allow Sn to be fixed on the trap 33 in a solid state.

Traps 34 through 36

Figure 10:
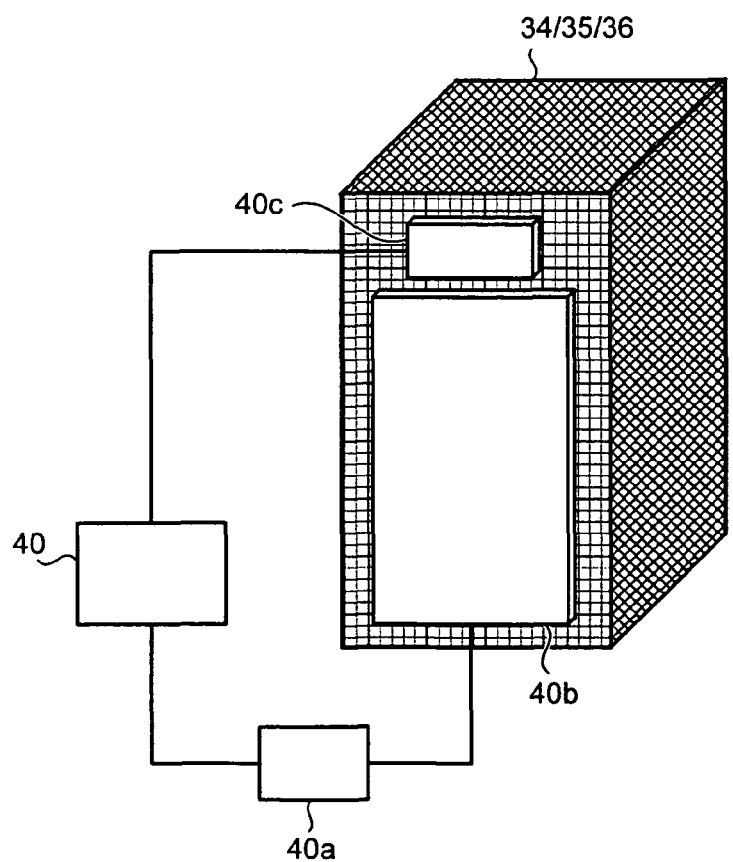
FIG. 10 schematically illustrates the configuration of a trap disposed at a predetermined position in a chamber of the third embodiment.

FIG. 10 schematically illustrates the configuration of the trap provided at a predetermined position inside the chamber in the third embodiment. As illustrated in FIG. 10, the traps 34 through 36 may be configured by having wires or ribbons being woven in a three-dimensional net (or lattice) form. The stannane gas flowing in the chamber 11 may pass near the surfaces of the traps 34 through 36. Accordingly, the traps 34 through 36 may preferably be heated, for example, to a temperature equal to or higher than the temperature at which the stannane gas is decomposed and Sn is deposited (e.g., 120° C.), as described above. The traps 34 through 36 may each be provided with a heater 40b heated with electric current. A power supply 40a may be connected to the heater 40b for supplying the electric current thereto. The traps 34 through 36 may each be provided with a temperature sensor 40c. The temperature detected by the temperature sensor 40c may be inputted to a temperature controller 40. The temperature controller 40 may control the electric current supplied to the heater 40b from the power supply 40a based on the temperature detected by the temperature sensor 40c. With this, the trap 34 through 36 may be heated to a temperature equal to or higher than the temperature at which Sn may be deposited, and the stannane gas flowing inside the chamber 11 may be heated and decomposed when passing near the surfaces of the traps 34 through 36, whereby Sn may be deposited on the surfaces of the wires, the ribbon, and so on. Deposited Sn may adhere to the surface of the traps 34 through 36. With this, Sn existing in the form of the stannane gas inside the chamber 11 may be collected with the traps 34 through 36. Further, maintaining the temperature of the traps 34 through 36 approximately below the melting point of Sn (232° C.) may allow Sn to be fixed inside the traps 34 through 36 in a solid state. For the traps 34 through 36, a porous material, such as sponge, may also be used.

With the above-described configuration, according to the third embodiment, the temperature of the optical element can be controlled so that the target material etched with the etching gas is not deposited on the optical element again; hence, an EUV light generation system can be realized, in which performance degradation of the optical elements provided in the chamber can be prevented.

Other configurations and advantages are similar to any of the above-described embodiments; thus, duplicate descriptions thereof are omitted here.

Fourth Embodiment

An EUV light generation system according to a fourth embodiment of this disclosure will be described in detail with reference to the drawings. In the above-described third embodiment, the temperatures of the traps 31 through 36 are controlled to be equal to or higher than the temperature at which the stannane gas is decomposed and Sn is deposited (about 120° C.) and lower than the temperature at which Sn remains in a solid state (232° C.), whereby Sn trapped in the traps 31 through 36 is fixed thereto in a solid state. On the other hand, in the fourth embodiment, Sn trapped in the traps 31 through 36 may be liquefied to flow out of the traps 31 through 36 by heating the traps 31 through 36 to a temperature equal to or higher than the temperature at which Sn melts. The molten Sn flowed out therefrom may be collected in a collection unit such as a bucket.

Figure 11:
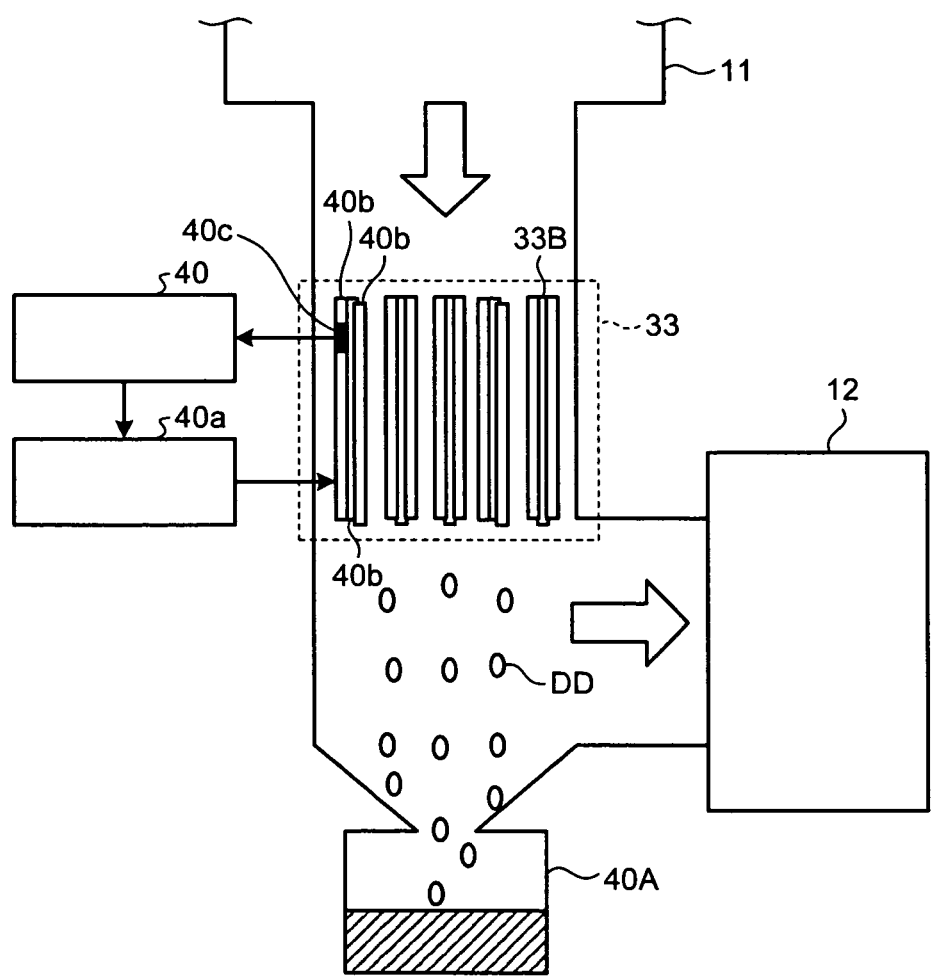
FIG. 11 schematically illustrates the configuration of a trap and a collection unit in an EUV light generation system according to a fourth embodiment of this disclosure.

FIG. 11 schematically illustrates the configuration of a trap and a collection unit in the EUV light generation system of the fourth embodiment. Note that, in FIG. 11, a trap provided at a connection between the chamber 11 and the discharge pump 12 will be illustrated as an example.

As illustrated in FIG. 11, in the EUV light generation system of the fourth embodiment, the connection between the chamber 11 and the discharge pump 12 may be bent in an L-shape. A connection with the chamber 11 may extend in the gravitational direction. A connection with the discharge pump 12 may extend horizontally so as to branch off from the connection with the chamber 11. A trap 33 for trapping the stannane gas flowing from the chamber 11 into the discharge pump 12 may be provided midway in the connection extending from the chamber 11 in the gravitational direction. The blades 33B of the trap 33 may each be provided with a heater 40b heated with electric current. A power supply 40a may be connected to the heater 40b for supplying the electric current thereto. At least one of the blades 33B may be provided with a temperature sensor 40c. The temperature detected by the temperature sensor 40c may be inputted to a temperature controller 40. The temperature controller 40 may control the electric current supplied to the heater 40b from the power supply 40a based on the temperature detected by the temperature sensor 40c. With this, the trap 33 may be heated to a temperature equal to or higher than the temperature at which Sn may melt, and molten SnDD may flow out from the trap 33.

Provided at the bottom of the connection extending from the chamber 11 in the gravitational direction may be a collection unit 40A for collecting the molten SnDD flowing out from the trap 33. With this, the molten SnDD flowing out from the trap 33 may be prevented from contaminating the optical elements and so on. By forming a coupling portion between the connection extending from the chamber 11 and the collection unit 40A in a frustoconical shape, the molten SnDD flowing out from the trap 33 can reliably be collected into the collection unit 40A.

In the fourth embodiment, the trap 33 provided at the connection between the chamber 11 and the discharge pump 12 has been illustrated as an example. However, this disclosure is not limited thereto, and a similar configuration can also be applied to any of the traps 31 through 36 illustrated in the third embodiment, for example. That is, a heater and a power supply for heating the trap, a temperature sensor for detecting the temperature of the trap, a temperature controller for controlling the temperature of the trap by driving the power supply based on the temperature detected by the temperature sensor, and a collection unit provided below with respect to the trap in the gravitational direction for collecting molten Sn flowing out therefrom may be provided to each of the traps, whereby Sn trapped in each trap can be liquefied and collected.

Other configurations and advantages are similar to those of any of the above-described embodiments; thus, duplicate descriptions thereof are omitted here.

First Modification

A modification of the gas introduction pipe in the above-described embodiments will be described in detail below with reference to the drawings. In the description to follow, a gas introduction pipe for flowing H radicals or $H_2$ gas along the surface of the EUV collector mirror M1 will be illustrated as an example.

Figure 12A:
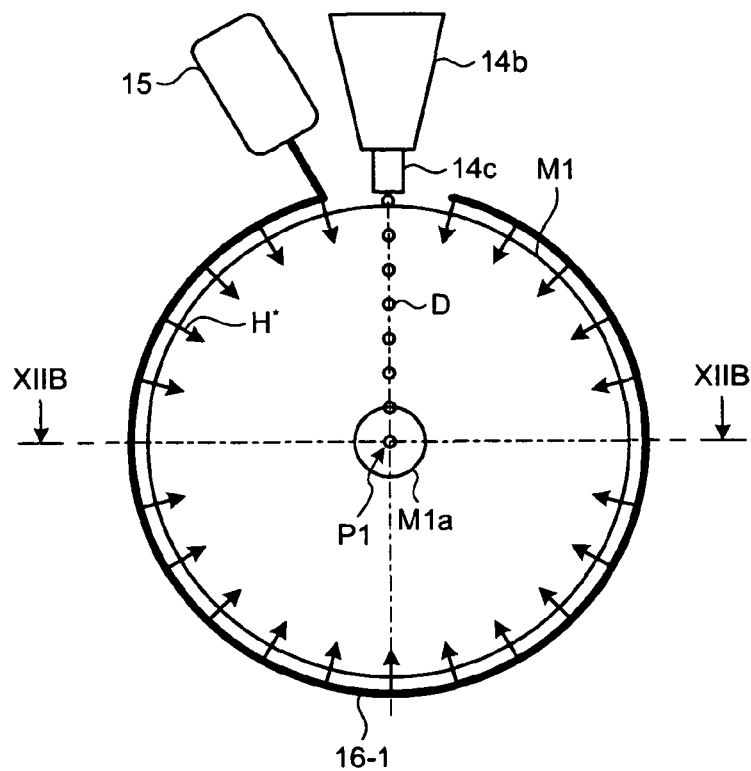
FIG. 12A schematically illustrates the configuration of a gas introduction pipe and an EUV collector mirror, viewed from the reflective surface side of the EUV collector mirror, according to a first modification of this disclosure.
Figure 12B:
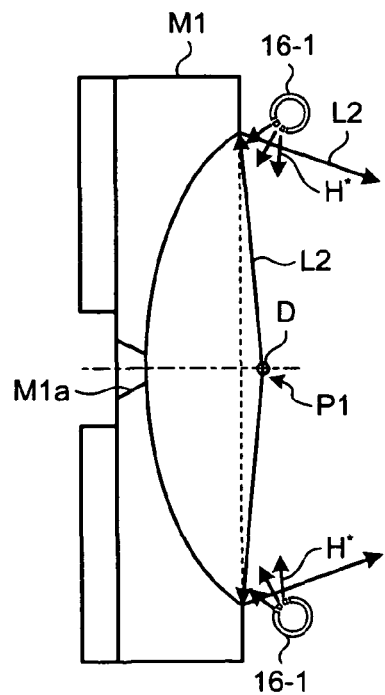
FIG. 12B is a sectional view, taken along XIIB-XIIB plane, schematically illustrating the configuration of the gas introduction pipe and the EUV collector mirror shown in FIG. 12A.

A gas introduction pipe according to a first modification will be described in detail with reference to the drawings. FIG. 12A schematically illustrates the configuration of the gas introduction pipe and the EUV collector mirror, viewed from the reflective surface side of the EUV collector mirror, according to the first modification. FIG. 12B is a sectional view, taken along XIIB-XIIB plane, schematically illustrating the configuration of the gas introduction pipe and the EUV collector mirror shown in FIG. 12A.

As illustrated in FIGS. 12A and 12B, in the first modification, a gas introduction pipe 16-1 extending from a radical generator 15 may extend so as to surround the reflective surface of the EUV collector mirror M1 from the outer peripheral side thereof. The gas introduction pipe 16-1 may have holes provided therein at substantially equal intervals, the holes being opened toward the reflective surface of the EUV collector mirror M1. The H radicals fed into the gas introduction pipe 16-1 from the radical generator 15 may blow out through the holes provided in the gas introduction pipe 16-1. With this, the H radicals may flow substantially uniformly along the surface of the reflective surface of the EUV collector mirror from the outer periphery of the reflective surface of the EUV collector mirror M1. As a result, Sn adhering particularly to the reflective surface of the EUV collector mirror M1 may be etched.

The gas introduction pipe 16-1 may, for example, be provided with a gap at a part thereof so that the droplet D outputted through a tip of the nozzle 14c of the droplet generator 14b may not be prevented from traveling toward the plasma generation region P1.

Second Modification

Figure 13A:
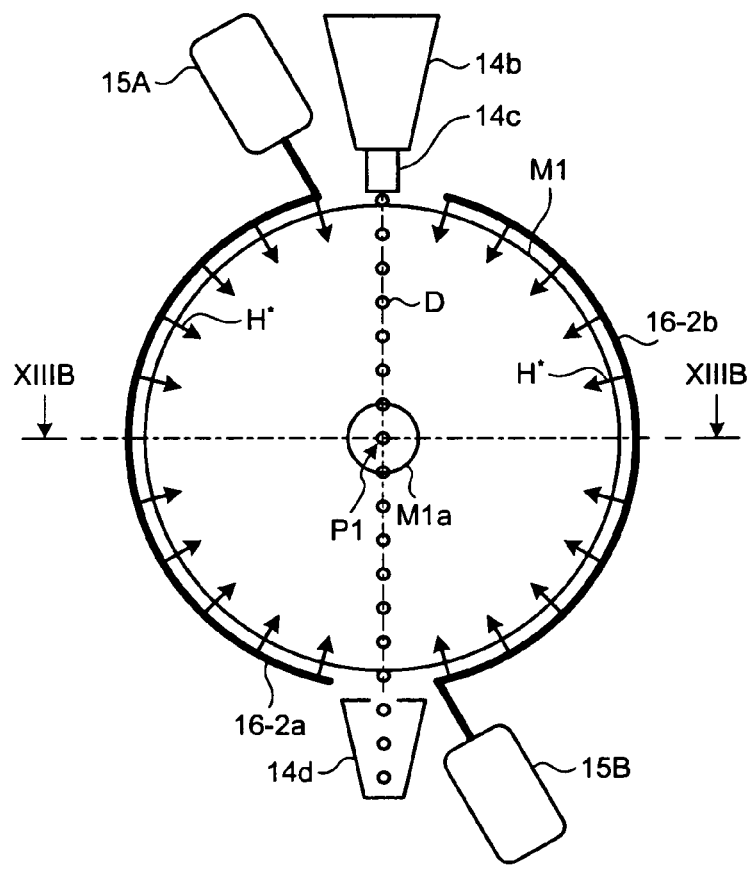
FIG. 13A schematically illustrates the configuration of a gas introduction pipe and an EUV collector mirror, viewed from the reflective surface side of the EUV collector mirror, according to a second modification of this disclosure.
Figure 13B:
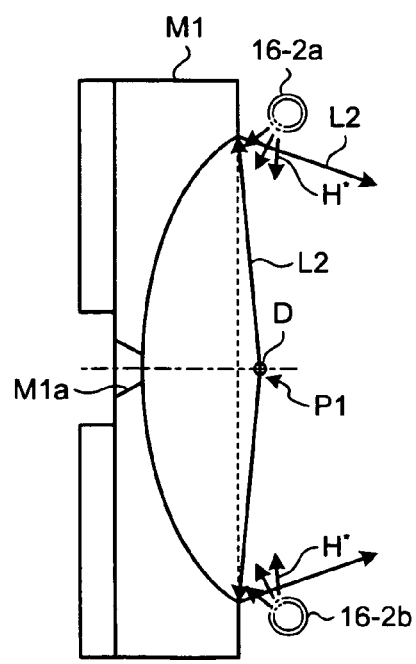
FIG. 13B is a sectional view, taken along XIIIB-XIIIB plane, schematically illustrating the configuration of the gas introduction pipe and the EUV collector mirror shown in FIG. 13A.

Gas introduction pipes according to a second modification will be described in detail with reference to the drawings. FIG. 13A schematically illustrates the configuration of the gas introduction pipes and the EUV collector mirror, viewed from the reflective surface side of the EUV collector mirror, according to the second modification. FIG. 13B is a sectional view, taken along XIIIB-XIIIB plane, schematically illustrating the configuration of the gas introduction pipes and the EUV collector mirror shown in FIG. 13A.

As illustrated in FIGS. 13A and 13B, a plurality of (e.g., two) radical generators 15A and 15B may be provided for an EUV collector mirror M1 in the second modification. The radical generators 15A and 15B may be disposed axisymmetrically, as viewed from the reflective surface side of the EUV collector mirror M1. A semiarc-shaped gas introduction pipe 16-2a may extend from the radical generator 15A so as to surround the reflective surface of the EUV collector mirror M1 from the outer peripheral side thereof. Similarly, a semiarc-shaped gas introduction pipe 16-2b may extend from the radical generator 15B so as to surround the reflective surface of the EUV collector mirror M1 from the outer peripheral side thereof. The reflective surface of the EUV collector mirror M1 may be surrounded by the two semiarc-shaped gas introduction pipes 16-2a and 16-2b. The gas introduction pipes 16-2a and 16-2b may have holes provided therein at substantially equal intervals, the holes being opened toward the reflective surface of the EUV collector mirror M1. The H radicals fed into the gas introduction pipes 16-2a and 16-2b from the radical generators 15A and 15B may blow out through the holes provided in the gas introduction pipes 16-2a and 16-2b. With this, the H radicals may flow substantially uniformly along the surface of the reflective surface of the EUV collector mirror from the outer periphery of the reflective surface of the EUV collector mirror M1. As a result, Sn adhering particularly to the reflective surface of the EUV collector mirror M1 may be etched.

The gas introduction pipes 16-2a and 16-2b may, for example, be provided with a gap at a part thereof so that the droplet D outputted through a tip of the nozzle 14c of the droplet generator 14b may not be prevented from traveling toward the plasma generation region P1, and the droplet D having passed the plasma generation region P1 or the remains of the droplet D may not be prevented from traveling toward the droplet collection unit 14d.

Third Modification

Figure 14A:
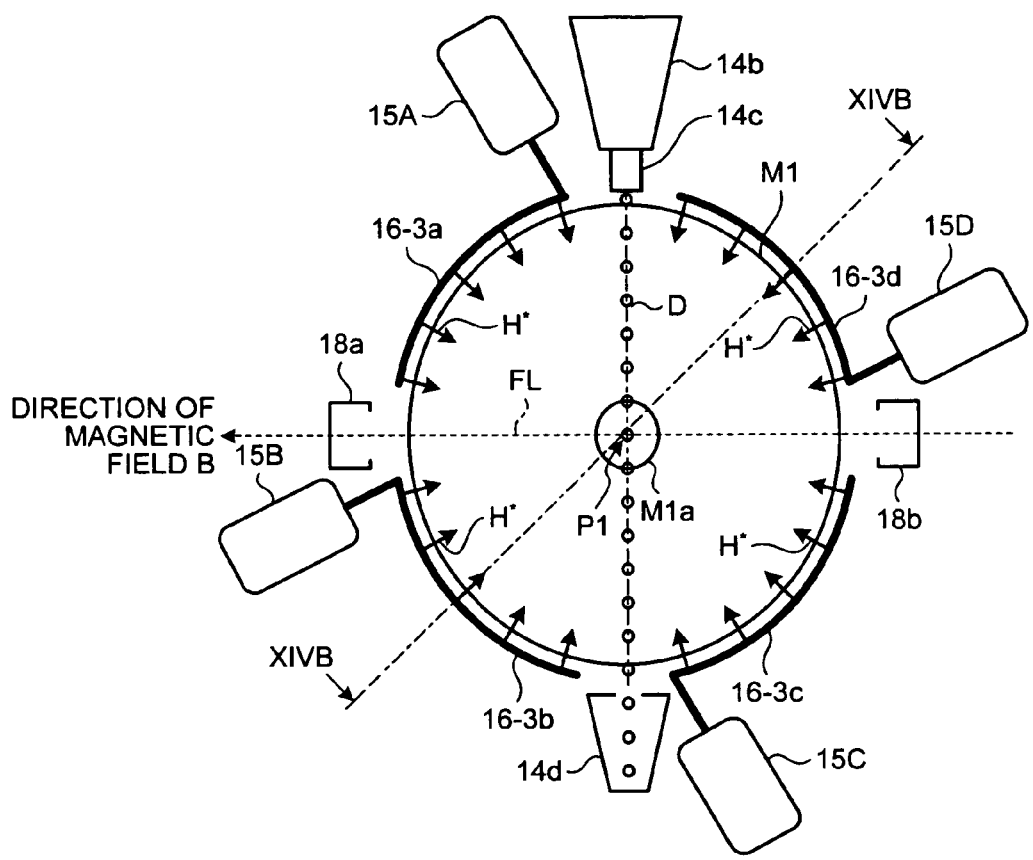
FIG. 14A schematically illustrates the configuration of a gas introduction pipe and an EUV collector mirror, viewed from the reflective surface side of the EUV collector mirror, according to a third modification of this disclosure.
Figure 14B:
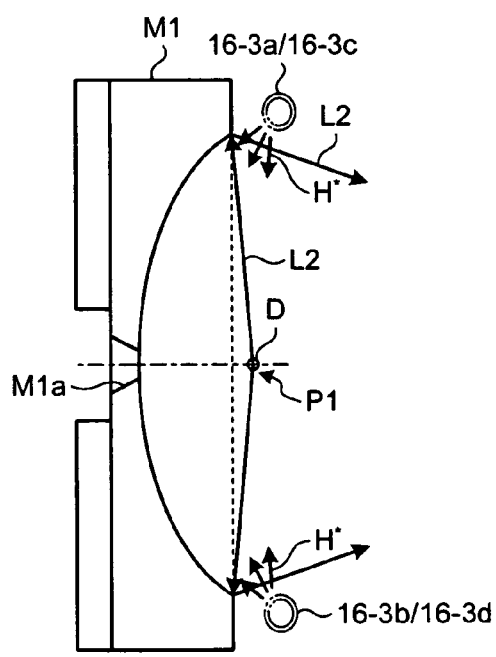
FIG. 14B is a sectional view, taken along XIVB-XIVB plane, schematically illustrating the configuration of the gas introduction pipe and the EUV collector mirror shown in FIG. 14A.

Gas introduction pipes according to a third modification will be described in detail with reference to the drawings. FIG. 14A schematically illustrates the configuration of the gas introduction pipes and the EUV collector mirror, viewed from the reflective surface side of the EUV collector mirror, according to the third modification. FIG. 14B is a sectional view, taken along XIVB-XIVB plane, schematically illustrating the configuration of the gas introduction pipes and the EUV collector mirror shown in FIG. 14A.

As illustrated in FIGS. 14A and 14B, in the third modification, a plurality of (e.g., four) radical generators 15A through 15D may be provided for an EUV collector mirror M1. The radical generators 15A through 15D may be disposed axisymmetrically at equal intervals, as viewed from the reflective surface side of the EUV collector mirror M1. A quarter-arc-shaped gas introduction pipe 16-3a may extend from the radical generator 15A so as to surround the reflective surface of the EUV collector mirror M1 from the outer peripheral side thereof. Similarly, quarter-arc-shaped gas introduction pipes 16-3b through 16-3d may extend from the radical generators 15B through 15D, respectively, so as to surround the reflective surface of the EUV collector mirror M1 from the outer peripheral side thereof. The reflective surface of the EUV collector mirror M1 may be surrounded by the four quarter-arc-shaped gas introduction pipes 16-3a through 16-3d from the outer peripheral side thereof. The gas introduction pipes 16-3a through 16-3d may have holes provided therein at substantially equal intervals, the holes being opened toward the reflective surface of the EUV collector mirror M1. The H radicals fed into the gas introduction pipes 16-3a through 16-3d from the radical generators 15A through 15D may blow out through the holes provided in the gas introduction pipes 16-3a through 16-3d. With this, the H radicals may flow substantially uniformly along the surface of the reflective surface of the EUV collector mirror from the outer periphery of the reflective surface of the EUV collector mirror M1. As a result, Sn adhering particularly to the reflective surface of the EUV collector mirror M1 may be etched.

The gas introduction pipes 16-3a and 16-3d may, for example, be provided with a gap at a part thereof so that the droplet D outputted through a tip of the nozzle 14c of the droplet generator 14b may not be prevented from traveling toward the plasma generation region P1, and the droplet D having passed the plasma generation region P1 or the remains of the droplet D may not be prevented from traveling toward the droplet collection unit 14d.

In the case where a magnetic field B passing through the plasma generation region P1 is generated and Sn debris, such as ions, generated in the plasma generation region P1 is mitigated and collected into ion collection units 18a and 18b, the gas introduction pipes may be provided with gaps at a part thereof through which the debris trapped in the magnetic field may pass so as not to hinder the passage.

Fourth Modification

Figure 15A:
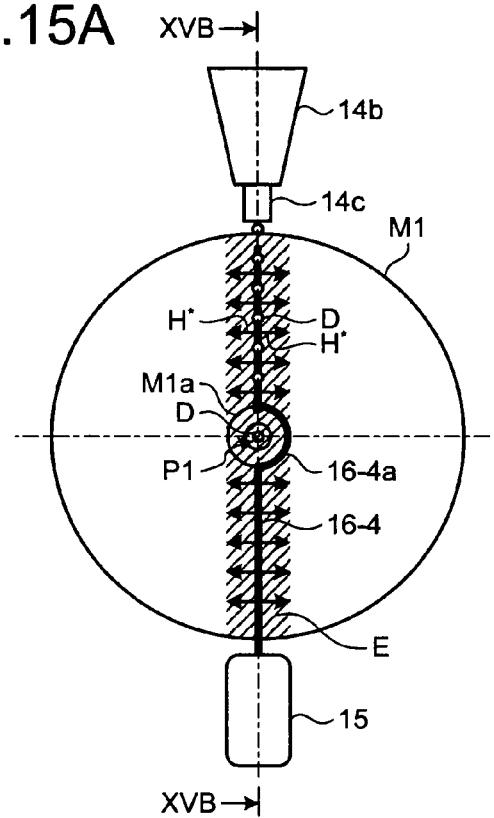
FIG. 15A schematically illustrates the configuration of a gas introduction pipe and an EUV collector mirror, viewed from the reflective surface side of the EUV collector mirror, according to a fourth modification of this disclosure.
Figure 15B:
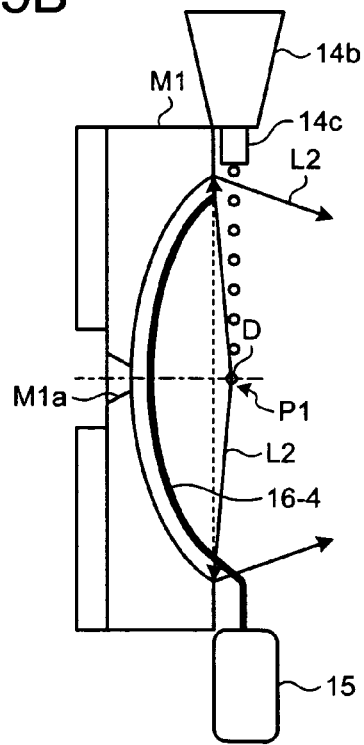
FIG. 15B is a sectional view, taken along XVB-XVB plane, schematically illustrating the configuration of the gas introduction pipe and the EUV collector mirror shown in FIG. 15A.

A gas introduction pipe according to a fourth modification will be described in detail with reference to the drawings. FIG. 15A schematically illustrates the configuration of the gas introduction pipe and the EUV collector mirror, viewed from the reflective surface side of the EUV collector mirror, according to the fourth modification. FIG. 15B is a sectional view, taken along XVB-XVB plane, schematically illustrating the configuration of the gas introduction pipe and the EUV collector mirror shown in FIG. 15A.

As illustrated in FIGS. 15A and 15B, a gas introduction pipe 16-4 of the fourth modification may substantially be linear, as viewed from the reflective surface side of an EUV collector mirror M1 (see FIG. 15A), and be curved in an arch along the reflective surface of the EUV collector mirror M1 (see FIG. 15B). Further, at a position at substantially the middle of the gas introduction pipe 16-4 corresponding to the through hole M1a in the EUV collector mirror M1, a curved portion 16-4a curved in a semiarc form may be provided so as to avoid the through hole M1a (see FIG. 15A).

The gas introduction pipe 16-4 having such a shape is preferably provided within an obscuration region E of EUV light L2. The obscuration region refers to a region corresponding to an angular range where EUV light collected by the EUV collector mirror is not used in an exposure apparatus. That is, the obscuration region is a three-dimensional region included in the angular range of the EUV light which is not used in the exposure apparatus.

The gas introduction pipe 16-4 may have holes provided therein on both sides at substantially equal intervals, the holes being opened to allow the etching gas to flow along the reflective surface of the EUV collector mirror M1. The H radicals fed into the gas introduction pipe 16-4 from a radical generator 15 may blow out through the holes provided in the gas introduction pipe 16-4. With this, the H radicals may flow substantially uniformly along the surface of the reflective surface of the EUV collector mirror from the center line passing through the through hole M1a at the center of the EUV collector mirror M1. As a result, Sn adhering particularly to the reflective surface of the EUV collector mirror M1 may be etched.

The gas introduction pipe 16-4 may be curved along the reflective surface of the EUV collector mirror M1. With this configuration, the droplet D outputted through a tip of the nozzle 14c of the droplet generator 14b into the obscuration region E may not be prevented from traveling toward the plasma generation region P1.

Fifth Modification

Figure 16A:
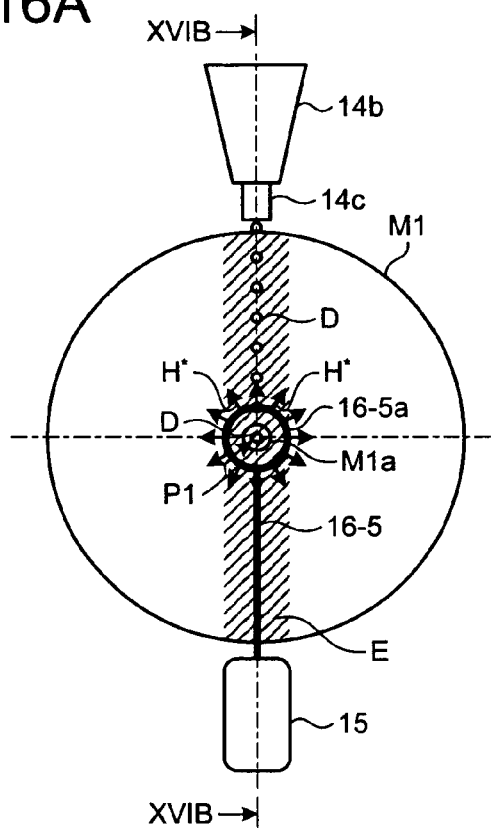
FIG. 16A schematically illustrates the configuration of a gas introduction pipe and an EUV collector mirror, viewed from the reflective surface side of the EUV collector mirror, according to a fifth modification of this disclosure.
Figure 16B:
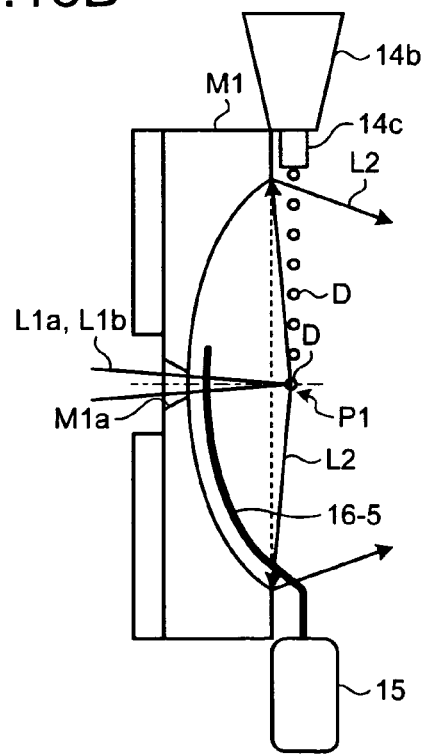
FIG. 16B is a sectional view, taken along XVIB-XVIB plane, schematically illustrating the configuration of the gas introduction pipe and the EUV collector mirror shown in FIG. 16A.

A gas introduction pipe according to a fifth modification will be described in detail with reference to the drawings. FIG. 16A schematically illustrates the configuration of the gas introduction pipe and the EUV collector mirror, viewed from the reflective surface side of the EUV collector mirror, according to the fifth modification. FIG. 16B is a sectional view, taken along XVIB-XVIB plane, schematically illustrating the configuration of the gas introduction pipe and the EUV collector mirror shown in FIG. 16A.

As illustrated in FIGS. 16A and 16B, a gas introduction pipe 16-5 of the fifth modification may substantially be linear, as viewed from the reflective surface side of an EUV collector mirror M1 (see FIG. 16A) and be curved in an arch from an edge of the reflective surface of the EUV collector mirror M1 toward the through hole M1a at the center thereof (see FIG. 16B). At a tip of the gas introduction pipe 16-5 corresponding to the through hole M1a in the EUV collector mirror M1, a circular portion 16-5a may be provided so as to surround the through hole M1a (see FIG. 16A). The gas introduction pipe 16-5 of the fifth modification as well may preferably be provided in the obscuration region E of the EUV light L2.

The circular portion 16-5a may have holes provided therein at substantially equal intervals, the holes being opened toward the outer periphery such that the etching gas flows along the surface of the EUV collector mirror M1. The H radicals fed into the gas introduction pipe 16-5 from a radical generator 15 may blow out through the holes provided in the circular portion 16-5a. With this, the H radicals may flow substantially uniformly along the surface of the reflective surface of the EUV collector mirror from the through hole M1a at the center of the EUV collector mirror M1. As a result, Sn adhering particularly to the reflective surface of the EUV collector mirror M1 may be etched.

The gas introduction pipe 16-5 may be curved along the reflective surface of the EUV collector mirror M1. With this configuration, the droplet D outputted through a tip of the nozzle 14c of the droplet generator 14b into the obscuration region E may not be prevented from traveling toward the plasma generation region P1.

Sixth Modification

Figure 17A:
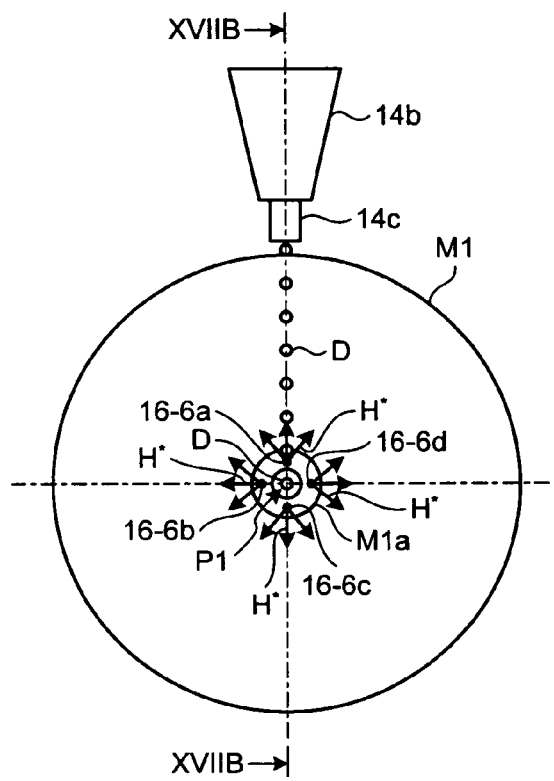
FIG. 17A schematically illustrates the configuration of a gas introduction pipe and an EUV collector mirror, viewed from the reflective surface side of the EUV collector mirror, according to a sixth modification of this disclosure.
Figure 17B:
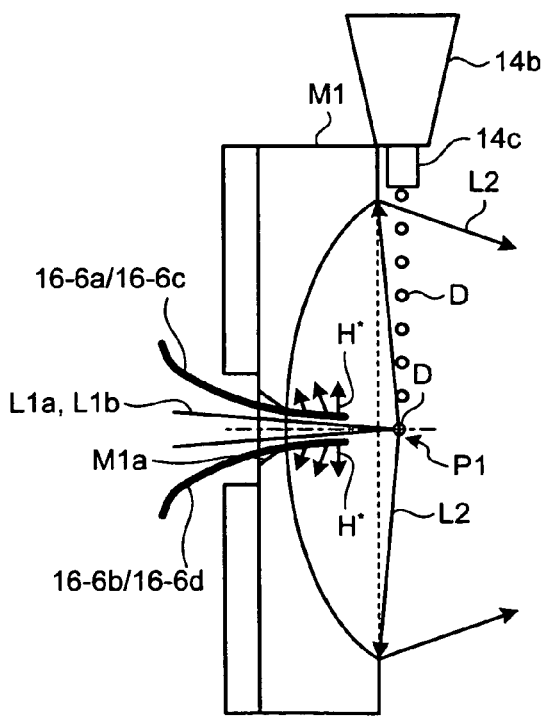
FIG. 17B is a sectional view, taken along XVIIB-XVIIB plane, schematically illustrating the configuration of the gas introduction pipe and the EUV collector mirror shown in FIG. 17A.

Next, gas introduction pipes according to a sixth modification will be described with reference to the drawings. FIG. 17A schematically illustrates the configuration of the gas introduction pipes and the EUV collector mirror, viewed from the reflective surface side of the EUV collector mirror, according to the sixth modification. FIG. 17B is a sectional view, taken along XVIIB-XVIIB plane, schematically illustrating the configuration of the gas introduction pipes and the EUV collector mirror shown in FIG. 17A.

As illustrated in FIGS. 17A and 17B, gas introduction pipes 16-6a through 16-6d of the sixth modification may each be shaped so as to project from a back surface side of an EUV collector mirror M1 toward the reflective surface side via the through hole M1a. The gas introduction pipes 16-6a through 16-6d may preferably disposed axisymmetrically, as viewed from the reflective surface side of the EUV collector mirror M1.

Leading ends of the gas introduction pipes 16-6a through 16-6d projecting through the through hole M1a may be provided with a plurality of holes opened along the reflective surface of the EUV collector mirror M1. The H radicals fed into the gas introduction pipes 16-6a through 16-6d from a radical generator 15 may blow out through the holes at the leading ends. With this, the H radicals may flow substantially uniformly along the surface of the reflective surface of the EUV collector mirror from the through hole M1a at the center of the EUV collector mirror M1. As a result, Sn adhering particularly to the reflective surface of the EUV collector mirror M1 may be etched.

Seventh Modification

Figure 18A:
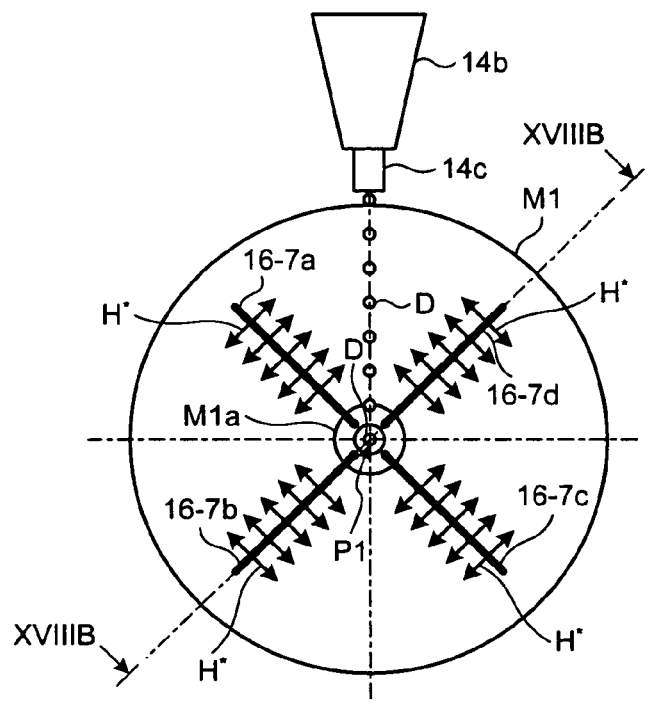
FIG. 18A schematically illustrates the configuration of a gas introduction pipe and an EUV collector mirror, viewed from the reflective surface side of the EUV collector mirror, according to a seventh modification of this disclosure.
Figure 18B:
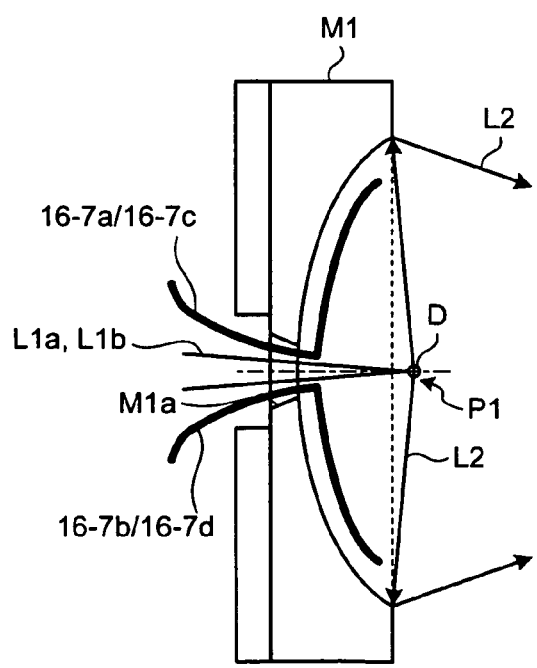
FIG. 18B is a sectional view, taken along XVIIIB-XVIIIB plane, schematically illustrating the configuration of the gas introduction pipe and the EUV collector mirror shown in FIG. 18A.

Gas introduction pipes according to a seventh modification will be described in detail with reference to the drawings. FIG. 18A schematically illustrates the configuration of the gas introduction pipes and the EUV collector mirror, viewed from the reflective surface side of the EUV collector mirror, according to the seventh modification. FIG. 18B is a sectional view, taken along XVIIIB-XVIIIB plane, schematically illustrating the configuration of the gas introduction pipes and the EUV collector mirror shown in FIG. 18A.

As illustrated in FIGS. 18A and 18B, gas introduction pipes 16-7a through 16-7d of the seventh modification may each be shaped so as to project from a back surface side of an EUV collector mirror M1 toward the reflective surface side via a through hole M1a. Portions of the gas introduction pipes 16-7a through 16-7d projecting through the through hole M1a may extend toward an edge of the reflective surface of the EUV collector mirror M1, and be curved along the reflective surface of the EUV collector mirror M1. The gas introduction pipes 16-7a through 16-7d may preferably be disposed axisymmetrically, as viewed from the reflective surface side of the EUV collector mirror M1.

Portions of the gas introduction pipes 16-7a through 16-7d projecting through the through hole M1a may be provided with a plurality of holes opened along the reflective surface of the EUV collector mirror M1. The H radicals fed into the gas introduction pipes 16-7a through 16-7d from a radical generator 15 may blow out through the holes at the leading ends. With this, the H radicals may spread and flow substantially uniformly along the surface of the reflective surface of the EUV collector mirror from the through hole M1a at the center of the EUV collector mirror M1. As a result, Sn adhering particularly to the reflective surface of the EUV collector mirror M1 may be etched.

Eighth Modification

Figure 19A:
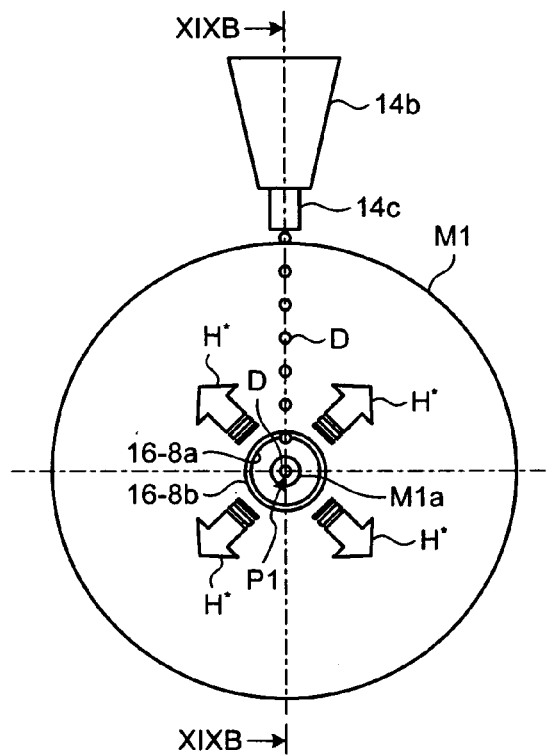
FIG. 19A schematically illustrates the configuration of a gas introduction pipe and an EUV collector mirror, viewed from the reflective surface side of the EUV collector mirror, according to an eighth modification of this disclosure.

A gas introduction pipe according to an eighth modification will be described in detail with reference to the drawings. FIG. 19A schematically illustrates the configuration of the gas introduction pipe and the EUV collector mirror, viewed from the reflective surface side of the EUV collector mirror, according to the eighth modification. FIG. 193 is a sectional view, taken along XIXB-XIXB plane, schematically illustrating the configuration of the gas introduction pipe and the EUV collector mirror shown in FIG. 19A.

Figure 19B:
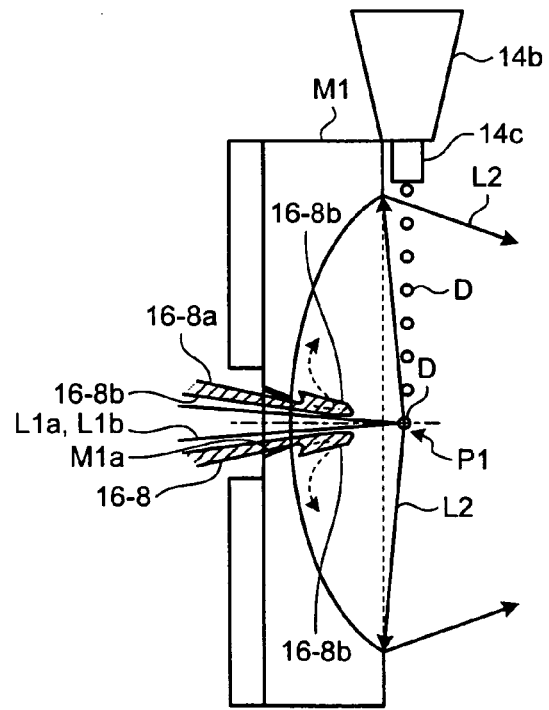
FIG. 19B is a sectional view, taken along XIXB-XIXB plane, schematically illustrating the configuration of the gas introduction pipe and the EUV collector mirror shown in FIG. 19A.
Figure 19C:
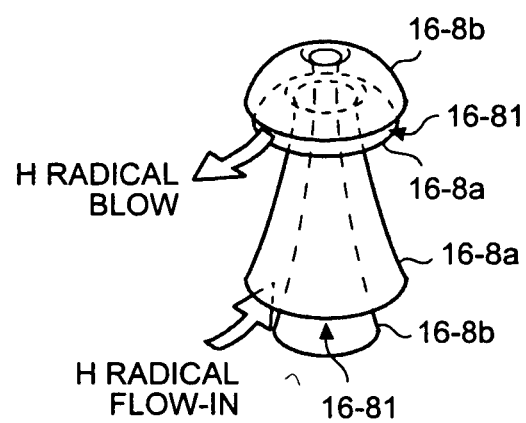
FIG. 19C is a perspective view schematically illustrating a shape of a tip portion of the gas introduction pipe according to the eighth modification.

As illustrated in FIGS. 19A through 19C, a gas introduction pipe 16-8 of the eighth modification may include a conical outer plate 16-8a with an open end thereof being spread in a dome shape, and a conical inner plate 16-8b with an open end thereof similarly spread in a dome shape and with the open end projecting from an opening in the outer plate 16-8a with a gap therebetween. That is, the gas introduction pipe 16-8 may have a double structure in which a gap is formed between the outer plate 16-8a and the inner plate 16-8b. The leading end of the gas introduction pipe 16-8 may project from the back surface side of an EUV collector mirror M1 toward the reflective surface via a through hole M1a. A gap 16-81 provided in the portion spread in a dome shape at the leading end of the gas introduction pipe 16-8 may face the reflective surface of the EUV collector mirror M1. The H radicals flow into the gas introduction pipe 16-8 through the gap in the gas introduction pipe 16-8 on the back surface side of the EUV collector mirror M1, and then be blown out through the gap at the leading end projecting toward the reflective surface side of the EUV collector mirror M1. With this, the H radicals may spread and flow substantially uniformly along the surface of the reflective surface of the EUV collector mirror from the through hole M1a at the center of the EUV collector mirror M1. As a result, Sn adhering particularly to the reflective surface of the EUV collector mirror M1 may be etched.

Ninth Modification

Figure 20A:
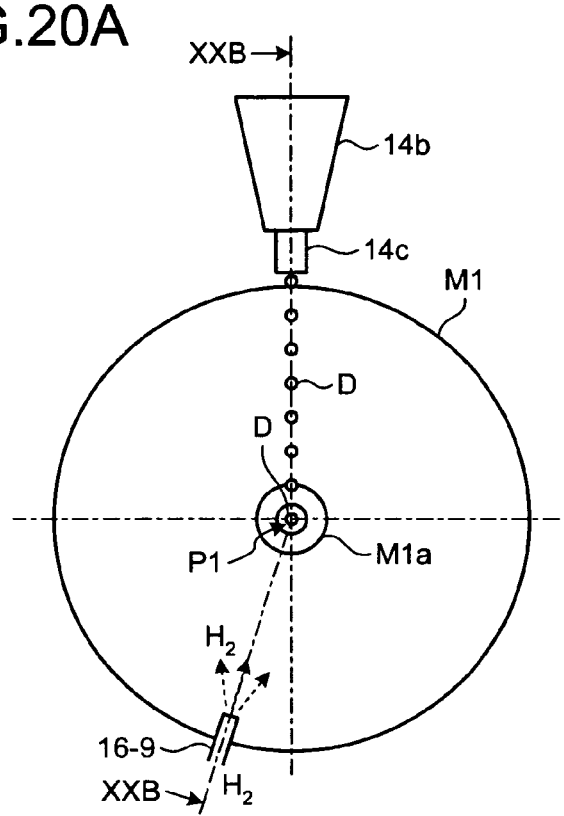
FIG. 20A schematically illustrates the configuration of a gas introduction pipe and an EUV collector mirror, viewed from the reflective surface side of the EUV collector mirror, according to a ninth modification of this disclosure.
Figure 20B:
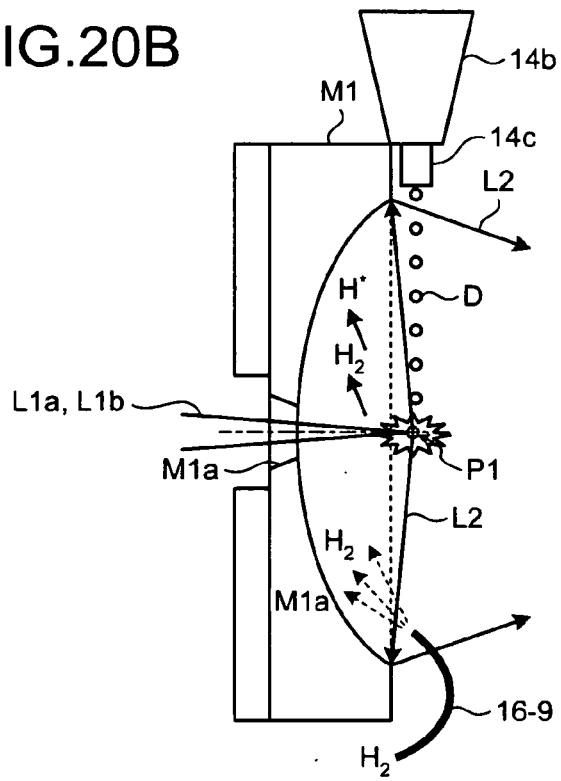
FIG. 20B is a sectional view, taken along XXB-XXB plane, schematically illustrating the configuration of the gas introduction pipe and the EUV collector mirror shown in FIG. 20A.

A ninth modification will be described in detail with reference to the drawings. In the above-described embodiments and modifications, $H_2$ has been turned into radicals and made to flow along the surfaces of the optical elements in the state of H radicals. In contrast, in the ninth modification, instead of H radicals, $H_2$ gas may be blown against the optical elements in the chamber 11, in particular against the EUV collector mirror M1 that is irradiated with EUV light L2 more strongly. FIG. 20A schematically illustrates the configuration of the gas introduction pipe and the EUV collector mirror, viewed from the reflective surface side of the EUV collector mirror, according to the ninth modification. FIG. 20B is a sectional view, taken along XXB-XXB plane, schematically illustrating the configuration of the gas introduction pipe and the EUV collector mirror shown in FIG. 20A.

As illustrated in FIGS. 20A and 20B, a gas introduction pipe 16-9 of the ninth modification may allow $H_2$ gas to flow along the reflective surface of an EUV collector mirror M1. The shape of the gas introduction pipe 16-9 can be modified into any shapes as long as it does not substantially block the EUV light L2 reflected by the EUV collector mirror M1.

The $H_2$ gas flowed along the reflective surface of the EUV collector mirror M1 may be turned into radicals when being irradiated with short-wavelength light, such as ultraviolet light, vacuum ultraviolet light, and the EUV light L2, generated in a plasma generation region P1. As a result, hydrogen flows in the H radical state along the surface of the EUV collector mirror M1. Consequently, Sn adhering particularly to the reflective surface of the EUV collector mirror M1 may be etched.

Tenth Modification

Figure 21A:
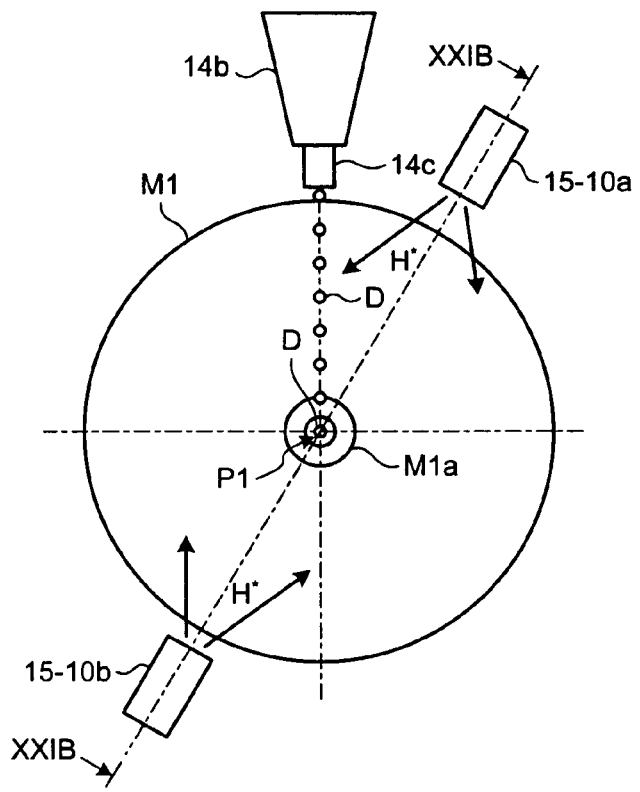
FIG. 21A schematically illustrates the configuration of a radical generation unit and an EUV collector mirror, viewed from the reflective surface side of the EUV collector mirror, according to a tenth modification of this disclosure.
Figure 21B:
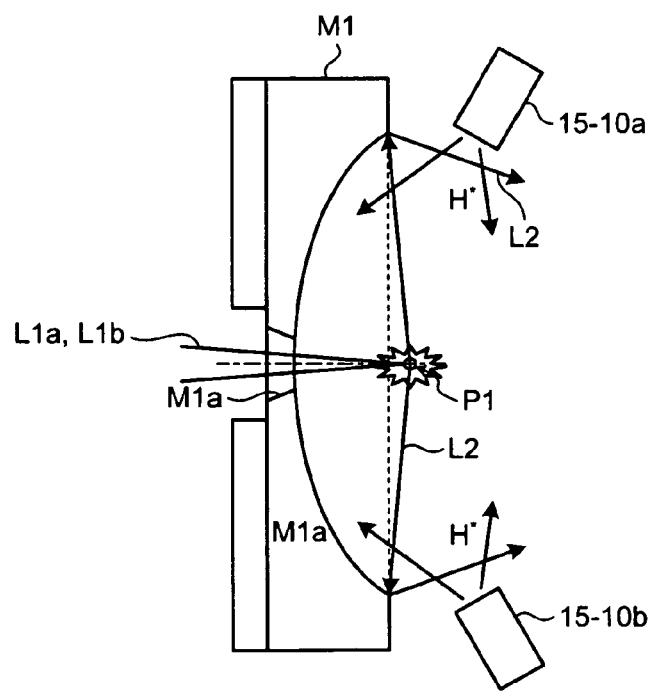
FIG. 21B is a sectional view, taken along XXIB-XXIB plane, schematically illustrating the radical generation unit and the EUV collector mirror shown in FIG. 21A.

A tenth modification will be described in detail with reference to the drawings. In the above-described embodiments and modifications, H radicals or $H_2$ gas has been made to flow along the surfaces of the optical elements in the chamber 11 via the gas introduction pipe; however, without being limited thereto, a radical generator may be provided for directly applying H radicals or $H_2$ gas on the surfaces of the optical elements inside the chamber 11. FIG. 21A schematically illustrates the configuration of the radical generator and the EUV collector mirror, viewed from the reflective surface side of the EUV collector mirror, according to the tenth modification. FIG. 21B is a sectional view, taken along XXIB-XXIB plane, schematically illustrating the configuration of the radical generator and the EUV collector mirror shown in FIG. 21A.

As illustrated in FIGS. 21A and 21B, in the tenth modification, a plurality of (e.g., two) radical generators 15-10a and 15-10b may be provided for an EUV collector mirror M1. The radical generators 15-10a and 15-10b may be disposed axisymmetrically above the reflective surface of the EUV collector mirror M1, as viewed from the reflective surface side of the EUV collector mirror M1. Radical output ports of the radical generators 15-10a and 15-10b may be oriented such that radicals flow along the surface of the EUV collector mirror M1. With this, H radicals outputted from the radical generators 15-10a and 15-10b may flow along the reflective surface of the EUV collector mirror M1. As a result, the H radicals may flow substantially uniformly from the outer periphery of the reflective surface of the EUV collector mirror M1, and Sn adhering particularly to the reflective surface of the EUV collector mirror M1 may be etched.

Eleventh Modification

Figure 22A:
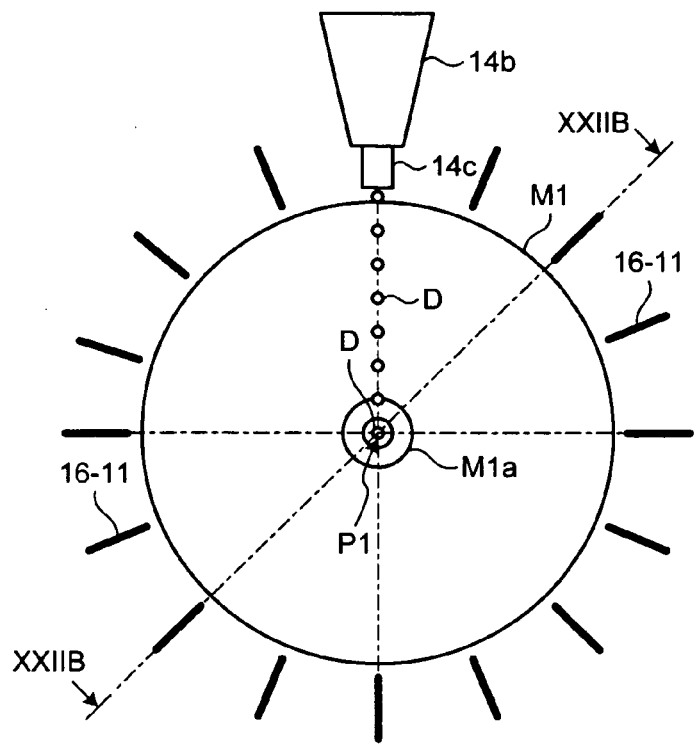
FIG. 22A schematically illustrates the configuration of a filament and an EUV collector mirror, viewed from the reflective surface side of the EUV collector mirror, according to an eleventh modification of this disclosure.
Figure 22B:
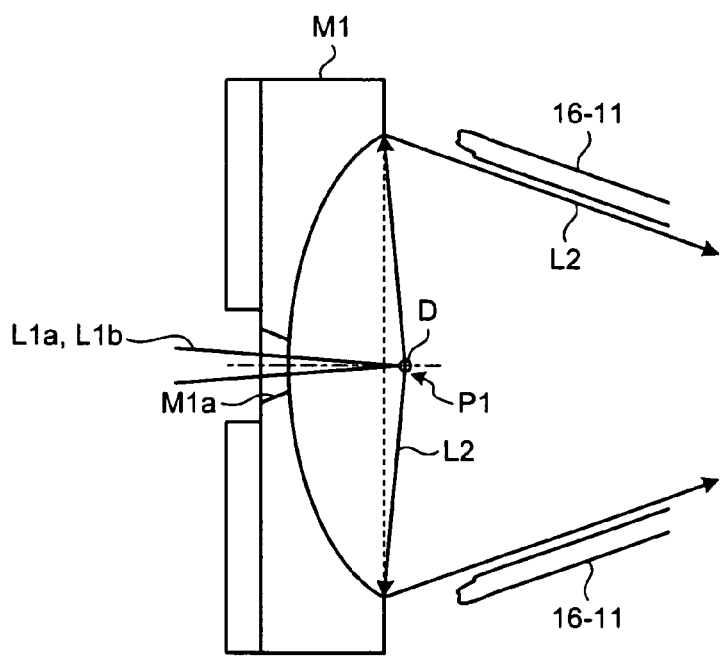
FIG. 22B is a sectional view, taken along XXIIB-XXIIB plane, schematically illustrating the configuration of the filament and the EUV collector mirror shown in FIG. 22A.

An eleventh modification will be described in detail with reference to the drawings. In the above-described embodiments and modifications, H radicals or $H_2$ gas has been made to flow along the surfaces of the optical elements in the chamber 11 via the gas introduction pipe. Without being limited thereto, however, a filament may be provided close to the optical element in the chamber 11 for turning $H_2$ gas into radicals, and the chamber 11 may be filled with $H_2$ gas. FIG. 22A schematically illustrates the configuration of the filament and the EUV collector mirror, viewed from the reflective surface side of the EUV collector mirror, according to the eleventh modification. FIG. 22B is a sectional view, taken along XXIIB-XXIIB plane, schematically illustrating the configuration of the filament and the EUV collector mirror shown in FIG. 22A.

As illustrated in FIGS. 22A and 22B, in the eleventh modification, a plurality of (e.g., two) filaments 16-11 may be provided for an EUV collector mirror M1. The filaments 16-11 may be disposed axisymmetrically outside the reflective surface of the EUV collector mirror M1, as viewed from the reflective surface side of the EUV collector mirror M1. $H_2$ gas may be turned into radicals as it receives energy when passing near the filaments 16-11, which then may be incident on the reflective surface of the EUV collector mirror M1. As a result, Sn adhering particularly to the reflective surface of the EUV collector mirror M1 may be etched.

Fifth Embodiment

Figure 23:
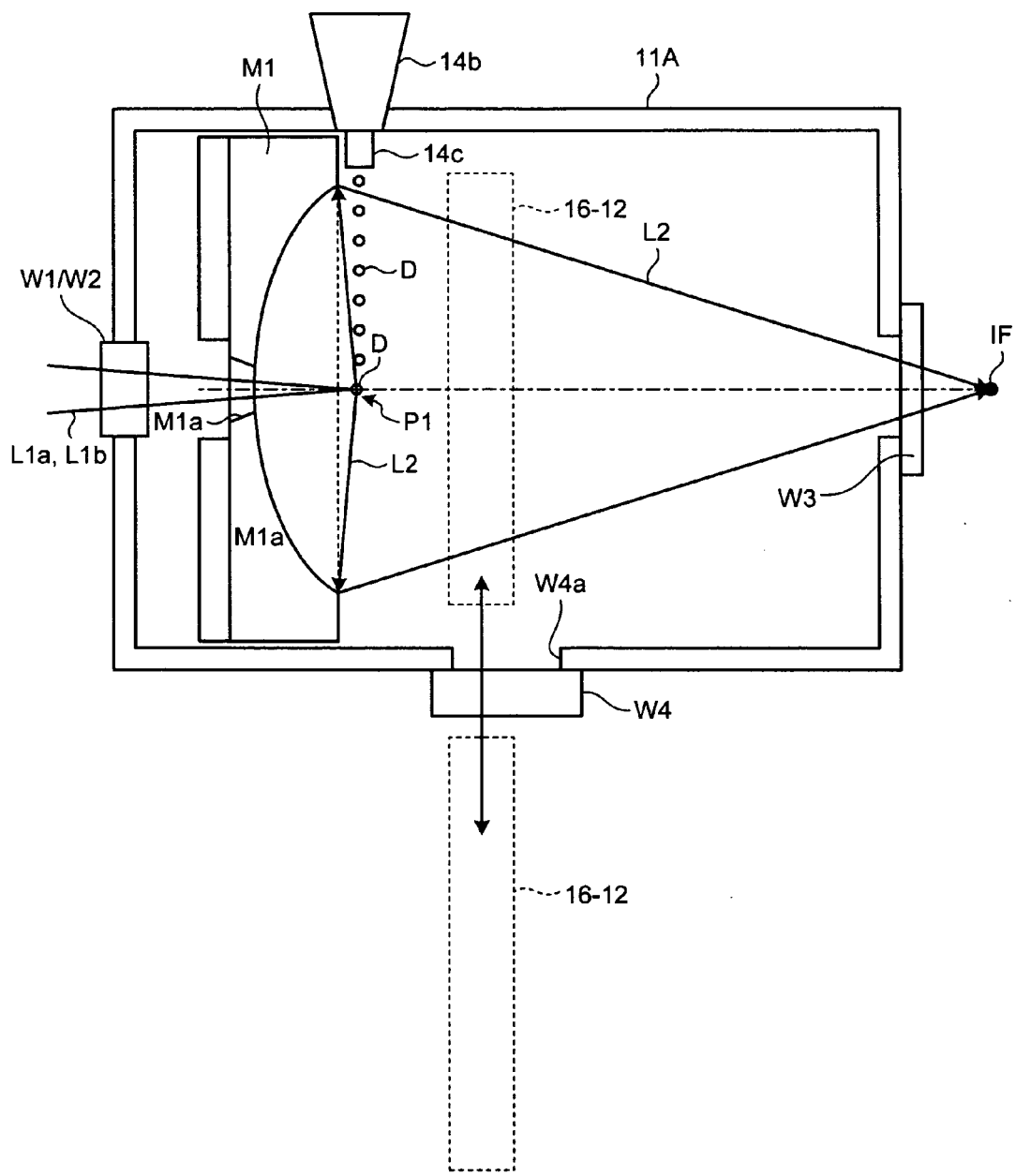
FIG. 23 is a sectional view schematically illustrating the configuration of an EUV light generation system according to a fifth embodiment of this disclosure.

An EUV light generation system according to a fifth embodiment of this disclosure will be described in detail with reference to the drawing. In the above-described embodiments and modifications, Sn adhering to the optical elements has been etched by blowing the H radicals or the $H_2$ gas to the optical element such that the H radicals or the $H_2$ gas flows along the reflective surface, while the EUV light generation system is in operation. In contrast, in the fifth embodiment, Sn adhering to the optical element may be etched by blowing H radicals or $H_2$ gas over the entire reflective surface of the optical element while the EUV light generation system is not in operation. FIG. 23 is a sectional view schematically illustrating the configuration of the EUV light generation system according to the fifth embodiment.

As illustrated in FIG. 23, a chamber 11A of the fifth embodiment may be provided with a gate W4a at the reflective surface side of the EUV collector mirror M1 inside the chamber 11A for introducing a radical generator 16-12 from the outside of the chamber 11A. The gate W4a can be sealed with a shutter W4. When the EUV light generation system is stopped, the shutter W4 is first moved so as to open the gate W4a, and the radical generator 16-12 may be introduced into the chamber 11A. After that, H radicals or $H_2$ gas may be blown from the radical generator 16-12 to the optical elements, for example, onto the entire reflective surface of the EUV collector mirror M1. As a result, Sn adhering to the optical elements, such as the EUV collector mirror M1, may be etched.

Other configurations and advantages are similar to those of any of the above-described embodiments; thus, duplicate descriptions thereof are omitted here.

Sixth Embodiment

Figure 24A:
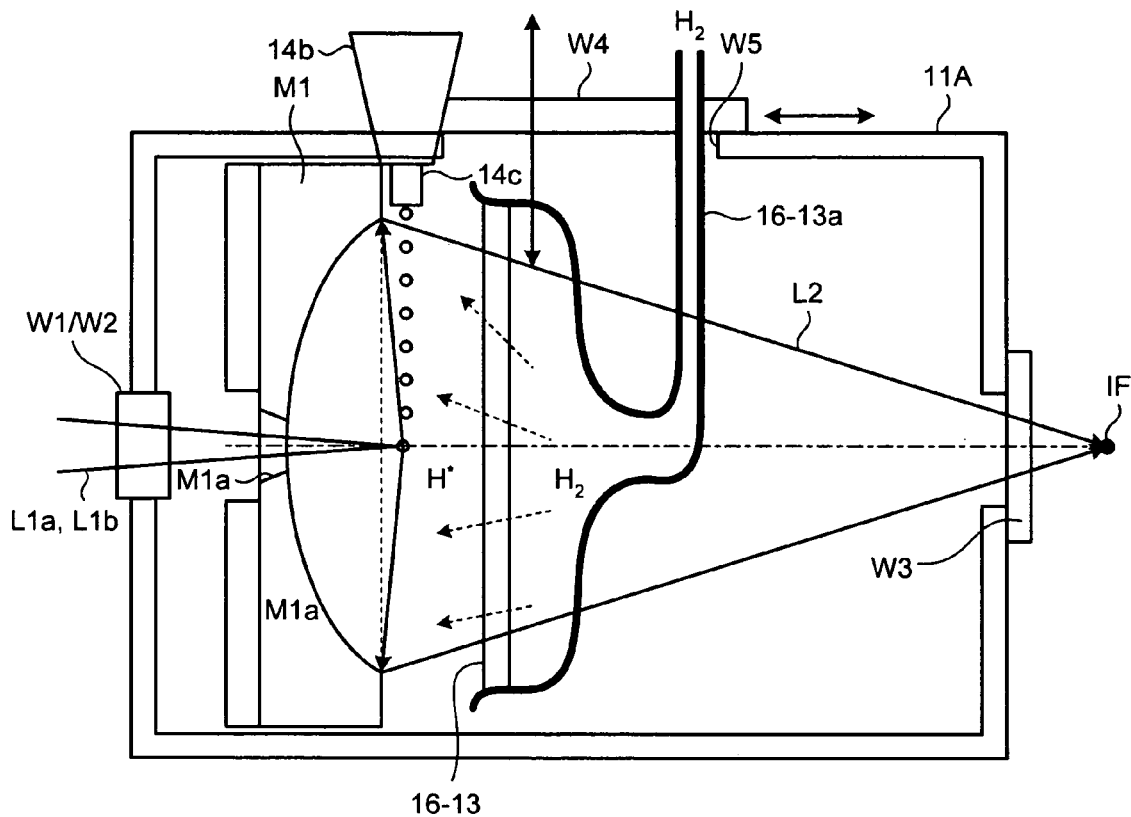
FIG. 24A is a sectional view schematically illustrating the configuration of an EUV light generation system according to a sixth embodiment of this disclosure.
Figure 24B:
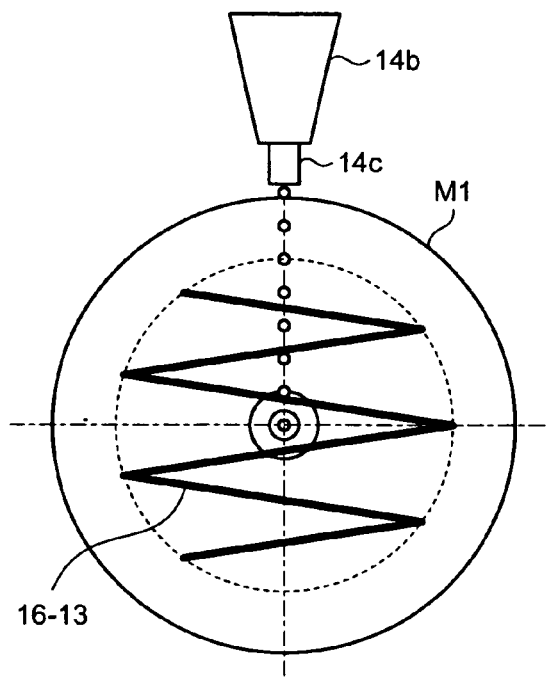
FIG. 24B schematically illustrates the configuration of a filament and an EUV collector mirror, viewed from the reflective surface side of the EUV collector mirror, shown in FIG. 24A.

An EUV light generation system according to a sixth embodiment of this disclosure will be described in detail with reference to the drawings. The radical generator 16-12 of the above-described fifth embodiment may be replaced with a gas introduction pipe for blowing out $H_2$ gas therefrom and a filament for turning the $H_2$ gas blown out from the gas introduction pipe into radicals. FIG. 24A is a sectional view schematically illustrating the configuration of the EUV light generation system according to the sixth embodiment. FIG. 24B schematically illustrates the configuration of the filament and the EUV collector mirror shown in FIG. 24A, as viewed from the reflective surface side of the EUV collector mirror.

As illustrated in FIGS. 24A and 24B, in the sixth embodiment, a gas introduction pipe 16-13a connected to an $H_2$ gas cylinder (not shown) may be introduced into a chamber 11A, in place of the radical generator 16-12. At a gas output port of the gas introduction pipe 16-13a, a filament 16-13 may be provided for turning the $H_2$ gas into radicals. When the EUV light generation system is stopped, a shutter W4 is first moved so as to open a gate W5, and the gas introduction pipe 16-13a may be introduced into the chamber 11A. After that, electric current is supplied o the filament 16-13, and $H_2$ gas may be made to flow into the gas introduction pipe 16-13a. With this, the $H_2$ gas blown out from the gas introduction pipe 16-13a may be turned into radicals, which then may be blown, as H radicals, against the optical elements, for example, the entire reflective surface of the EUV collector mirror M1. As a result, Sn adhering to the optical elements, such as the EUV collector mirror M1, may be etched.

Other configurations and advantages are similar to those of any of the above-described embodiments; thus, duplicate descriptions thereof are omitted here.

The above-described embodiments and modifications thereof are merely examples for implementing this disclosure, and this disclosure is not limited to these. Making various modifications according to the specifications or the like is within the scope of this disclosure, and it is apparent from the above description that other various embodiments are possible within the scope of this disclosure. For example, it is needless to state that the modifications illustrated for each of the embodiments can be applied to other embodiments as well.

Further, in the above-described embodiments, embodiments in which the etching gas is made to flow along the surface of the optical elements has been illustrated as preferred examples; however, without being limited to these embodiments, a certain amount of Sn can be etched even when the etching gas is blown against the reflective surfaces of the optical elements. As in the embodiments illustrated in FIGS. 23, 24A, and 24B, it is preferable that the etching gas is blown against the entire surface of the optical element.

As a device for controlling the temperature of the optical element, an example in which temperature-controlled heat carrier is made to flow in the substrate for the optical element and an example in which the heater and the chiller are used in combination have been shown; however, without being limited to these examples, any system capable of heating and cooling can be applied. For example, the temperature of the optical element may be controlled with high precision by controlling the electric current with a Peltier element being used as a temperature control element.

What is claimed is:

1. An extreme ultraviolet light generation system used with a laser apparatus and connected to an external device so as to supply extreme ultraviolet light thereto, the extreme ultraviolet light generation system comprising:
    a chamber provided with at least one inlet through which a laser beam is introduced thereinto;
    a target supply unit provided to the chamber and configured for supplying a target material to a predetermined region inside the chamber;
    a discharge pump connected to the chamber;
    a collector mirror disposed inside the chamber and configured for collecting extreme ultraviolet light emitted when the target material is irradiated with the laser beam in the predetermined region inside the chamber;
    an etching gas introduction unit provided to the chamber through which etching gas passes,
    the etching gas being introduced to etch debris of the target material which is emitted when the target material is irradiated with the laser beam inside the chamber and adheres to the collector mirror; and
    at least one temperature control mechanism configured for controlling a temperature of the collector mirror, wherein
    the etching gas introduction unit is provided with at least one opening oriented toward a reflective surface of the collector mirror.

2. The extreme ultraviolet light generation system according to claim 1, wherein the target material is tin.

3. The extreme ultraviolet light generation system according to claim 1, wherein the etching gas is $H_2$ gas.

4. The extreme ultraviolet light generation system according to claim 1, wherein the etching gas is H radical gas.

5. The extreme ultraviolet light generation system according to claim 1, wherein:
    the at least one temperature control mechanism includes a first temperature control mechanism connected to the collector mirror, and
    the first temperature control mechanism includes:
    a temperature control element provided to the collector mirror,
    a power supply connected to the temperature control element configured for supplying electric current to the temperature control element,
    a temperature sensor configured for detecting a temperature of the collector mirror, and
    a temperature controller configured for controlling a temperature of the collector mirror by controlling the electric current supplied to the temperature control element from the power supply based on the temperature detected by the temperature sensor.

6. The extreme ultraviolet light generation system according to claim 5, wherein the first temperature control mechanism further includes:
    a heat carrier,
    a temperature control unit configured for controlling the temperature of the heat carrier and sending out the heat carrier, and
    a flow channel configured for guiding the temperature-controlled heat carrier sent out from the temperature control unit to the collector mirror.

7. The extreme ultraviolet light generation system according to claim 5, wherein the temperature control element is a Peltier element.

8. The extreme ultraviolet light generation system according to claim 5, wherein
    the first temperature control maintains is configured to maintain the temperature of the collector mirror within a first predetermined temperature range.

9. The extreme ultraviolet light generation system according to claim 8, wherein
    the first predetermined temperature range is a temperature range within which a reaction rate at which the debris reacts with the etching gas and a gaseous reaction product is generated is greater than a reaction rate at which the gaseous reaction product is decomposed and the debris is deposited.

10. The extreme ultraviolet light generation system according to claim 1, further comprising
    at least one trap unit disposed inside the chamber configured for causing the debris to be deposited from the gaseous reaction product and trapping the debris therein.

11. The extreme ultraviolet light generation system according to claim 1, wherein
    the at least one trap unit includes a first trap unit disposed between the predetermined region inside the chamber and a reflective surface of the collector mirror.

12. The extreme ultraviolet light generation system according to claim 1, wherein the first trap unit includes:
    a temperature sensor configured for detecting a temperature of the first trap unit,
    a heater configured for heating the first trap unit,
    a power supply configured for supplying electric current to the heater, and
    a temperature controller configured for controlling the electric current supplied to the heater from the power supply based on the temperature detected by the temperature sensor, and
    the first trap unit is provided with a through hole through which the extreme ultraviolet light passes.

13. The extreme ultraviolet light generation system according to claim 12, wherein
    the temperature controller is configured to control the electric current supplied to the heater so that the first trap unit is maintained within a temperature range which is below the melting point of the debris and within which a reaction rate at which the debris reacts with the etching gas and the gaseous reaction product is generated is less than a reaction rate at which the gaseous reaction product is decomposed and the debris is deposited.

14. The extreme ultraviolet light generation system according to claim 12, wherein:
    the temperature controller is configured to control the electric current supplied to the heater so that the first trap unit is maintained within a temperature range which is at or above the melting point and below the boiling point of the debris and within which a reaction rate at which the debris reacts with the etching gas and the gaseous reaction product is generated is less than a reaction rate at which the gaseous reaction product is decomposed and the debris is deposited, and
    the first trap unit further includes a collection unit for collecting the debris molten on the surface of the first trap unit.

15. The extreme ultraviolet light generation system according to claim 10, wherein
    the at least one trap unit includes a second trap unit disposed inside the chamber near a connection between the chamber and the external apparatus.

16. The extreme ultraviolet light generation system according to claim 15, wherein the second trap unit includes:

a temperature sensor configured for detecting a temperature of the second trap unit,
a heater configured for heating the second trap unit,
a power supply configured for supplying electric current to the heater, and
a temperature controller configured for controlling the electric current supplied to the heater from the power supply based on the temperature detected by the temperature sensor, and
the second trap unit is provided with a through hole through which the extreme ultraviolet light passes.

17. The extreme ultraviolet light generation system according to claim 16, wherein
the temperature controller is configured to control the electric current supplied to the heater so that the second trap unit is maintained within a temperature range which is below the melting point of the debris and within which a reaction rate at which the debris reacts with the etching gas and the gaseous reaction product is generated is less than a reaction rate at which the gaseous reaction product is decomposed and the debris is deposited.

18. The extreme ultraviolet light generation system according to claim 16, wherein:
the temperature controller is configured to control the electric current supplied to the heater so that the second trap unit is maintained within a temperature range which is at or above the melting point and below the boiling point of the debris and within which a reaction rate at which the debris reacts with the etching gas and the gaseous reaction product is generated is less than a reaction rate at which the gaseous reaction product is decomposed and the debris is deposited, and
the second trap unit further includes a collection unit configured for collecting the debris molten on the surface of the second trap unit.

19. The extreme ultraviolet light generation system according to claim 10, wherein
the at least one trap unit includes a third trap unit disposed inside the chamber near a connection between the chamber and the discharge pump.

20. The extreme ultraviolet light generation system according to claim 19, wherein the third trap unit includes:
a temperature sensor configured for detecting a temperature of the third trap unit,
a heater configured for heating the third trap unit,
a power supply configured for supplying electric current to the heater, and
a temperature controller configured for controlling the electric current supplied to the heater from the power supply based on the temperature detected by the temperature sensor, and
the third trap unit is configured to have air permeability.

21. The extreme ultraviolet light generation system according to claim 20, wherein
the temperature controller is configured to control the electric current supplied to the heater so that the third trap unit is maintained within a temperature range which is below the melting point of the debris and within which a reaction rate at which the debris reacts with the etching gas and the gaseous reaction product is generated is less than a reaction rate at which the gaseous reaction product is decomposed and the debris is deposited.

22. The extreme ultraviolet light generation system according to claim 20, wherein:
the temperature controller is configured to control the electric current supplied to the heater so that the third trap unit is maintained within a temperature range which is at or above the melting point and below the boiling point of the debris and within which a reaction rate at which the debris reacts with the etching gas and the gaseous reaction product is generated is less than a reaction rate at which the gaseous reaction product is decomposed and the debris is deposited, and
the third trap unit further includes a collection unit configured for collecting the debris molten on the surface of the third trap unit.

23. The extreme ultraviolet light generation system according to claim 10, wherein
the at least one trap unit includes a fourth trap unit disposed inside the chamber.

24. The extreme ultraviolet light generation system according to claim 23, wherein the fourth trap unit includes:
a temperature sensor configured for detecting a temperature of the fourth trap unit,
a heater configured for heating the fourth trap unit,
a power supply configured for supplying electric current to the heater, and a temperature controller configured for controlling the electric current supplied to the heater from the power supply based on the temperature detected by the temperature sensor.

25. The extreme ultraviolet light generation system according to claim 24, wherein
the temperature controller is configured to control the electric current supplied to the heater so that the fourth trap unit is maintained within a temperature range which is below the melting point of the debris and within which a reaction rate at which the debris reacts with the etching gas and the gaseous reaction product is generated is less than a reaction rate at which the gaseous reaction product is decomposed and the debris is deposited.

26. The extreme ultraviolet light generation system according to claim 25, wherein:
the temperature controller is configured to control the electric current supplied to the heater so that the fourth trap unit is maintained within a temperature range which is at or above the melting point and below the boiling point of the debris and within which a reaction rate at which the debris reacts with the etching gas and the gaseous reaction product is generated is less than a reaction rate at which the gaseous reaction product is decomposed and the debris is deposited, and
the fourth trap unit further includes a collection unit configured for collecting the debris molten on the surface of the fourth trap unit.

* * * * *